US012628429B2

(12) United States Patent (10) Patent No.: US 12,628,429 B2
Patil et al. (45) Date of Patent: May 12, 2026

(54) DEEP TRENCH CAPACITORS (DTCS) EMPLOYING BYPASS METAL TRACE SIGNAL ROUTING, AND RELATED INTEGRATED CIRCUIT (IC) PACKAGES AND FABRICATION METHODS

(71) Applicant: QUALCOMM Incorporated, San Diego, CA (US)

(72) Inventors: Aniket Patil, San Diego, CA (US); Hong Bok We, San Diego, CA (US); Joan Rey Villarba Buot, Escondido, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 774 days.

(21) Appl. No.: 17/816,502

(22) Filed: Aug. 1, 2022

(65) Prior Publication Data

US 2024/0038753 A1 Feb. 1, 2024

(51) Int. Cl.
H10D 86/85 (2025.01)
H10W 70/05 (2026.01)
(Continued)

(52) U.S. Cl.
CPC .......... H10D 86/85 (2025.01); H10W 70/611 (2026.01); H10W 70/685 (2026.01);
(Continued)

(58) Field of Classification Search
CPC ......... H03H 1/0007; H03H 2001/0014; H10D 1/043; H10D 1/716; H01L 23/5385;
(Continued)

(56) References Cited

U.S. PATENT DOCUMENTS

2010/0052099 A1 3/2010 Chang et al.
2017/0338207 A1 11/2017 Chen et al.
(Continued)

FOREIGN PATENT DOCUMENTS

CN 114582836 A 6/2022
EP 0908952 A2 4/1999
JP 2017038085 A 2/2017

OTHER PUBLICATIONS

International Search Report and Written Opinion for International Patent Application No. PCT/US2023/071035, mailed Nov. 2, 2023, 13 pages.

*Primary Examiner* — Jessica S Manno
*Assistant Examiner* — Victor Joseph Lasasso
(74) *Attorney, Agent, or Firm* — Withrow & Terranova, PLLC

(57) ABSTRACT

Deep trench capacitors (DTCs) employing bypass metal trace signal routing supporting signal bypass routing, and related integrated circuit (IC) packages and fabrication methods are disclosed. The DTC includes an outer metallization layer (e.g., a redistribution layer (RDL)) to provide an external interface to the DTC. In exemplary aspects, to make available signal routes that can extend through a DTC, an outer metallization layer of the DTC includes additional metal interconnects. These additional metal interconnects are not coupled the capacitors in the DTC. These additional metal interconnects are interconnected to each other by metal traces (e.g., metal lines) in the outer metallization layer of the DTC to provide bypass signal routes through the DTC. This is opposed to signal paths in a package substrate in which the DTC is coupled or embedded having to be routed around the DTC in the package substrate.

30 Claims, 15 Drawing Sheets

(51) Int. Cl.

| | |
|---|---|
| *H10W 70/60* | (2026.01) |
| *H10W 70/65* | (2026.01) |
| *H10W 70/654* | (2026.01) |
| *H10W 70/685* | (2026.01) |
| *H10W 72/00* | (2026.01) |
| *H10W 72/29* | (2026.01) |
| *H10W 72/90* | (2026.01) |
| *H10W 74/15* | (2026.01) |
| *H10W 90/00* | (2026.01) |

(52) U.S. Cl.
CPC ............ *H10W 90/00* (2026.01); *H10W 70/05* (2026.01); *H10W 70/65* (2026.01); *H10W 70/654* (2026.01); *H10W 72/019* (2026.01); *H10W 72/072* (2026.01); *H10W 72/073* (2026.01); *H10W 72/29* (2026.01); *H10W 72/90* (2026.01); *H10W 72/9223* (2026.01); *H10W 72/923* (2026.01); *H10W 72/934* (2026.01); *H10W 72/9415* (2026.01); *H10W 72/9445* (2026.01); *H10W 74/15* (2026.01); *H10W 90/724* (2026.01); *H10W 90/734* (2026.01)

(58) Field of Classification Search
CPC ............ B81C 1/0023; B81B 2207/096; B81B 2207/092; B81B 7/0006
See application file for complete search history.

(56) References Cited

U.S. PATENT DOCUMENTS

| | | | |
|---|---|---|---|
| 2019/0393153 A1 | 12/2019 | Wang et al. | |
| 2020/0239298 A1* | 7/2020 | Hsieh | B81B 7/0006 |
| 2022/0262778 A1 | 8/2022 | Yu et al. | |
| 2023/0317773 A1* | 10/2023 | Shekhar | H03H 1/0007 257/534 |

* cited by examiner

FROM FIG. 9B

PROVIDE WAFER (800) TO FORM SUBSTRATE (428)

702

FORM TRENCHES (409) IN SUBSTRATE (428)

704

FORM CAPACITORS (406) IN TRENCHES (409) AND FORM METAL LAYER (804) TO FORM METAL CONTACTS (420) AND FORM PASSIVATION LAYER (806) ON METAL LAYER (804)

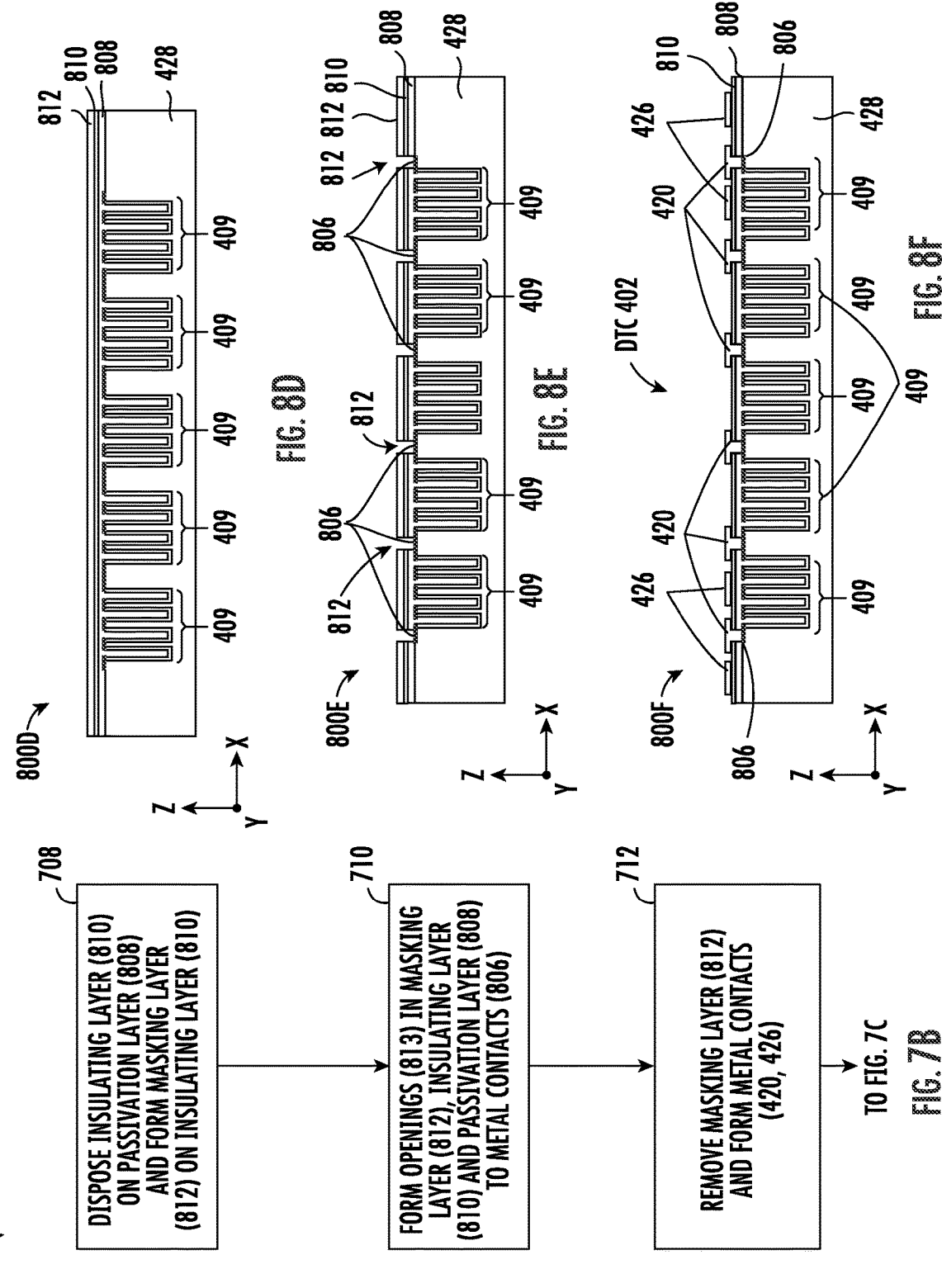

FROM FIG. 9A

DISPOSE UNDERFILE MATERIAL (1002) UNDER DIE (210) AND DTC (206) ON OUTER SURFACE (204(1)) OF PACKAGE SUBSTRATE (206)

906

DISPOSE OVERMOLD MATERIAL (1004) ON DIE (210) AND DTC (202)

DEEP TRENCH CAPACITORS (DTCS) EMPLOYING BYPASS METAL TRACE SIGNAL ROUTING, AND RELATED INTEGRATED CIRCUIT (IC) PACKAGES AND FABRICATION METHODS

BACKGROUND

I. Field of the Disclosure

The field of the disclosure relates to integrated circuit (IC) packages that include one or more semiconductor dies supported by a package substrate, and more particularly to coupling of capacitors to a package substrate of an IC package to support signal processing and/or power integrity.

II. Background

Integrated circuits (ICs) are the cornerstone of electronic devices. ICs are packaged in an IC package, also called a "semiconductor package" or "chip package." The IC package includes one or more semiconductor dice ("dies" or "dice") that are mounted on and electrically coupled to a package substrate to provide physical support and an electrical interface to the die(s). The die(s) is electrically interfaced to metal interconnects (e.g., metal traces, metal lines) in a top metallization layer of the package substrate. The package substrate can also include one or more other metallization layers that include metal interconnects (e.g., metal traces, metal lines) with vertical interconnect accesses (vias) coupling the metal interconnects together between adjacent metallization layers to provide electrical interfaces through the package substrate to the die(s). The package substrate also includes a bottom, outer metallization layer that includes metal interconnects coupled to external metal interconnects (e.g., ball grid array (BGA) interconnects) to provide an external interface between the die(s) in the IC package. The external metal interconnects can also be coupled (e.g., soldered) to traces in a printed circuit board (PCB) to attach the IC package to the PCB to interface its die(s) with the other circuitry coupled to the PCB.

It is common to include capacitors in IC packages. Capacitors may be coupled to an IC package to provide a decoupling capacitance for circuits in a die to shunt noise from one electrical circuit (e.g., a power supply circuit) to another electrical circuit (e.g., a powered electrical circuit). Capacitors may also be coupled to an IC package as part of a filtering circuit for a die. Such capacitors can be provided as deep trench capacitors (DTCs). A DTC is formed similar to a semiconductor device, and thus has the advantage of being able to be fabricated using semiconductor fabrication methods. An advantage of using DTCs is that DTCs can be placed closer to a circuit in the IC package. A DTC includes vertical semiconductor devices formed in deep trenches in a silicon substrate to form parallel plate capacitors. The capacitors are each formed by an inner electrode as an inner conducive layer that is surrounded by a dielectric material within a given trench. An outer plate as an outer conductive layer is disposed in the trench adjacent to the dielectric material such that a capacitor is formed between the inner electrode and outer plate. A DTC can be coupled to an outer surface of a package substrate that is also coupled to a die in an IC package as a die-side capacitor (DSC). A DTC can also be coupled to an opposite outer surface of a package substrate that the die is disposed on as a land-side capacitor (LSC). A DTC can also be embedded within a package substrate of an IC package. For example, the capacitor may be embedded in a core substrate of a cored package substrate. In each of these examples of DTCs, metal interconnects/metal traces within metallization layers of the package substrate provide an electrical connection between a die and the DTC.

SUMMARY OF THE DISCLOSURE

Aspects disclosed herein include deep trench capacitors (DTCs) employing bypass metal trace signal routing. Related integrated circuit (IC) packages and fabrication methods are also disclosed. The DTC can be coupled to or embedded in a package substrate of the IC package to provide capacitance to circuits in a semiconductor die ("die") in the IC package. The DTC is coupled to the die through metal lines in a metallization layer(s) of the package substrate coupling the DTC to the die. In exemplary aspects, the DTC includes a substrate with trenches disposed therein. Capacitors are formed in the trenches with metal contacts (i.e., terminals) of the capacitors disposed adjacent to an outer surface of the substrate. The DTC also includes an outer metallization layer (e.g., a redistribution layer (RDL)) to provide an external interface to the DTC. The outer metallization layer includes an insulating layer with metal interconnects (e.g., metal pads) disposed therein and coupled to the metal contacts of the capacitors. Metal bumps can be formed in openings in the insulating layer and coupled to the metal interconnects to provide an interface between the metal bumps and the capacitors in the DTC. In exemplary aspects, to make available signal paths that can extend through a DTC, the outer metallization layer of the DTC also includes additional metal interconnects. These additional metal interconnects in the outer metallization layer of the DTC are not coupled to the capacitors in the DTC in an example. These additional metal interconnects are interconnected to each other by metal traces (e.g., metal lines) in the outer metallization layer of the DTC to provide bypass signal routes through the DTC. For example, with the DTC coupled or embedded in a package substrate, metal interconnects in a metallization layer(s) of the package substrate that need to be coupled to each other can each be coupled to additional interconnected metal interconnects in the outer metallization layer of the DTC to provide a bypass signal path through the DTC. This is opposed to having to route signal paths around the DTC in the package substrate. As another example, a plurality of interconnected additional metal interconnects can be formed in the outer metallization layer of the DTC to provide a plurality of signal bypass routes that extend through the DTC.

In this regard, in one exemplary aspect, a DTC is provided. The DTC comprises a substrate comprising a first surface and a first side. The DTC also comprises a first capacitor disposed in the substrate. The first capacitor comprises a first conductive layer and a second conductive layer. The DTC also comprises a metallization layer adjacent to the first surface. The metallization layer comprises an insulating layer, a first metal contact disposed in the insulating layer and coupled to the first conductive layer, a second metal contact disposed in the insulating layer and coupled to the second conductive layer, a third metal contact disposed in the insulating layer, the third metal contact adjacent to the first surface of the substrate, and a fourth metal contact disposed in the insulating layer, the fourth metal contact adjacent to the first surface of the substrate. The metallization layer also comprises a first metal line disposed in the insulating layer, the first metal line coupling the third metal contact to the fourth metal contact.

In another exemplary aspect, a method of fabricating a DTC is provided. The method comprises providing a substrate comprising a first surface and a first side. The method also comprises forming a first capacitor in the substrate, the first capacitor comprising a first conductive layer and a second conductive layer. The method also comprises forming a metallization layer adjacent to the first surface of the substrate, comprising: forming an insulating layer, forming a first metal contact disposed in the insulating layer and coupled to the first conductive layer, forming a second metal contact in the insulating layer and coupled to the second conductive layer, forming a third metal contact in the insulating layer and adjacent to the first surface of the substrate, forming a fourth metal contact disposed in the insulating layer and adjacent to the first surface of the substrate, and forming a first metal line in the insulating layer coupled to the third metal contact and the fourth metal contact.

In another exemplary aspect, and IC package is provided. The IC package comprises a package substrate comprising a first surface and one or more first metallization layers each comprising one or more metal interconnects. The IC package also comprises a die coupled to the first surface of the package substrate. The IC package also comprises a DTC coupled to the package substrate. The DTC comprises a substrate comprising a first surface and a first side. The DTC also comprises a first capacitor disposed in the substrate. The first capacitor comprises a first conductive layer and a second conductive layer. The DTC also comprises a metallization layer adjacent to the first surface. The metallization layer comprises an insulating layer, a first metal contact disposed in the insulating layer and coupled to the first conductive layer, a second metal contact disposed in the insulating layer and coupled to the second conductive layer, a third metal contact disposed in the insulating layer, the third metal contact adjacent to the first surface of the substrate, and a fourth metal contact disposed in the insulating layer, the fourth metal contact adjacent to the first surface of the substrate. The metallization layer also comprises a first metal line disposed in the insulating layer, the first metal line coupling the third metal contact to the fourth metal contact. The one or more first metallization layers further comprises a third metallization layer comprising a first metal interconnect coupled to the third metal contact. The third metallization layer further comprises a second metal interconnect coupled to the fourth metal contact.

BRIEF DESCRIPTION OF THE FIGURES

FIG. 7A-7C is a flowchart illustrating another exemplary fabrication process of fabricating a DTC that includes additional metal interconnects interconnected to each other by metal lines in the outer metallization layer of the DTC to provide bypass signal routes through the DTC, including but not limited to the DTCs in FIGS. 2-4B and 5C;

FIGS. 8A-8H are exemplary fabrication stages during fabrication of a DTC according to the exemplary DTC fabrication process in FIGS. 7A-7C;

DETAILED DESCRIPTION

Figure 1A:
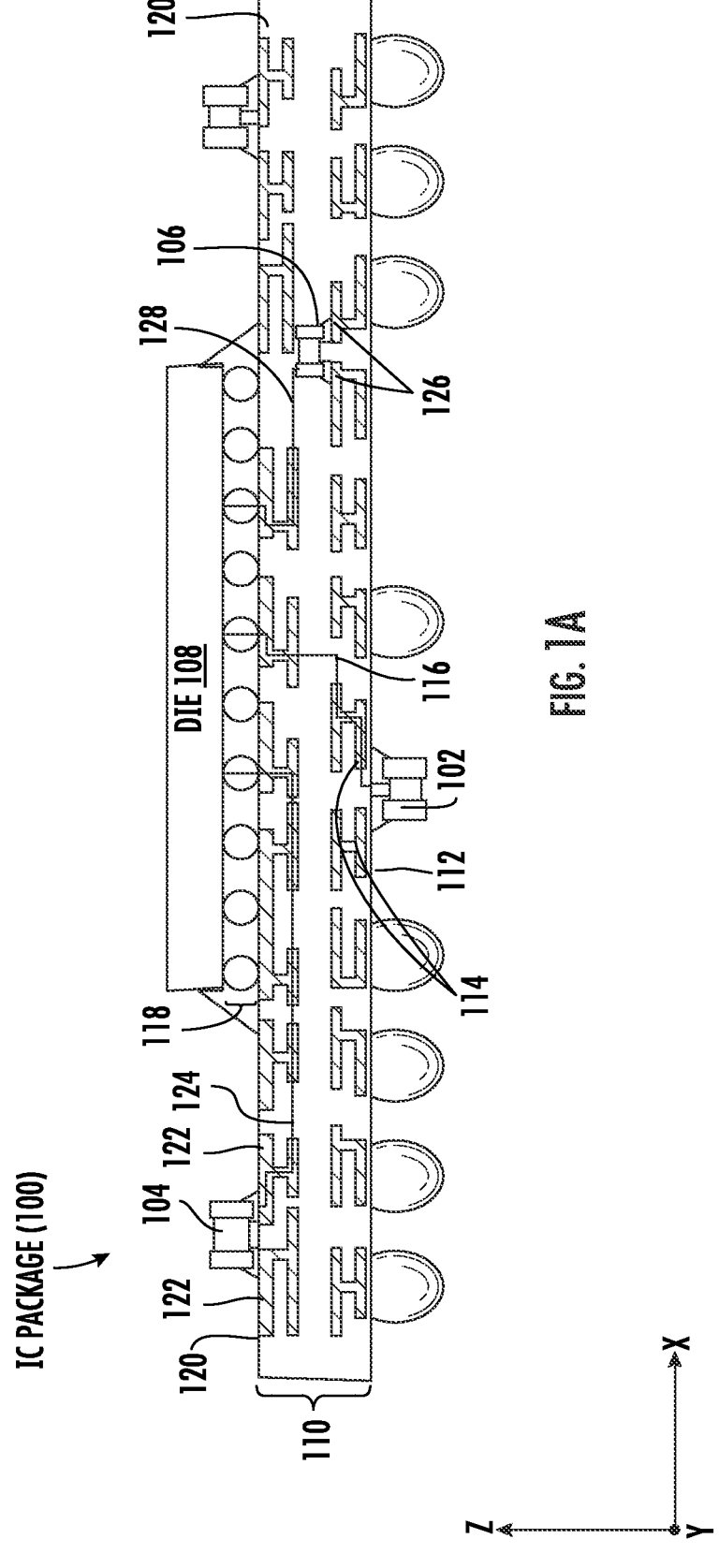
FIG. 1A is a side view of an exemplary integrated circuit (IC) package that includes a package substrate with deep trench capacitors (DTCs) that include a land-side capacitor (LSC), a die-side capacitor (DSC), and embedded DTC.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include deep trench capacitors (DTCs) employing bypass metal trace signal routing. Related integrated circuit (IC) packages and fabrication methods are also disclosed. The DTC can be coupled to or embedded in a package substrate of the IC package to provide capacitance to circuits in a semiconductor die ("die") in the IC package. The DTC is coupled to the die through metal lines in a metallization layer(s) of the package substrate coupling the DTC to the die. In exemplary aspects, the DTC includes a substrate with trenches disposed therein. Capacitors are formed in the trenches with metal contacts (i.e., terminals) of the capacitors disposed adjacent to an outer surface of the substrate. The DTC also includes an outer metallization layer (e.g., a redistribution layer (RDL)) to provide an external interface to the DTC. The outer metallization layer includes an insulating layer with metal interconnects (e.g., metal pads) disposed therein and coupled to the metal contacts of the capacitors. Metal bumps can be formed in openings in the insulating layer and coupled to the metal interconnects to provide an interface between the metal bumps and the capacitors in the DTC. In exemplary aspects, to make available signal paths that can extend through a DTC, the outer metallization layer of the DTC also includes additional metal interconnects. These additional metal interconnects in the outer metallization layer of the DTC are not coupled to the capacitors in the DTC in an example. These additional metal interconnects are interconnected to each other by metal traces (e.g., metal lines) in the outer metallization layer of the DTC to provide bypass signal routes through the DTC. For example, with the DTC coupled or embedded in a package substrate, metal interconnects in a metallization layer(s) of the package substrate that need to be coupled to each other can each be coupled to additional interconnected metal interconnects in the outer metallization layer of the DTC to provide a bypass signal path through the DTC. This is opposed to having to route signal paths around the DTC in the package substrate. As another example, a plurality of interconnected additional metal interconnects can be formed in the outer metallization layer of the DTC to provide a plurality of signal bypass routes that extend through the DTC.

Before discussing examples of DTCs with outer metallization layers that include bypass metal line signal routing to support signal bypass routing through the DTC starting at FIG. 2, an example of an IC package that includes DTCs that do not have bypass metal line signal routing is first described below with reference to FIGS. 1A and 1B.

FIG. 1A is a side view of an IC package 100 that includes DTCs in the form of a land-side capacitor (LSC) 102, a die-side capacitor (DSC) 104, and a package substrate embedded DTC 106. The IC package 100 includes a die 108 coupled to a package substrate 110. The LSC 102, DSC 104, and/or embedded DTC 106 may be provided in the IC package 100 to be coupled to circuits in the die 108 to shunt noise from one electrical circuit (e.g., a power supply circuit) to another electrical circuit (e.g., a powered electrical circuit), or as part of a filtering circuit in the die 108, as examples. Such capacitors can be provided as deep trench capacitors (DTCs). A DTC is formed similar to a semiconductor device, and thus has the advantage of being able to be fabricated using semiconductor fabrication methods. An advantage of using DTCs is that they can be placed closer to the die 108 in the IC package 100.

The LSC 102 is mounted on a bottom surface 112 of the package substrate 110. The LSC 102 is electrically coupled to the die 108 by the LSC 102 being coupled to metal interconnects 114 that are coupled to metal lines 116 in a metallization layer(s) of the package substrate 110. The metal lines 116 are directly or indirectly coupled to die interconnects 118 to couple the LSC 102 to the die 108. The DSC 104 is mounted on a top surface 120 of the package substrate 110 in this example. Thus, to not interfere with the die 108, the DSC 104 is mounted to the package substrate 110 in an area that is laterally displaced from the die 108 in the horizontal direction (X- and Y-axes directions). The DSC 104 is also electrically coupled to the die 108 by the DSC 104 being coupled to metal interconnects 122 that are coupled to metal lines 124 in a metallization layer(s) of the package substrate 110. The metal lines 124 are coupled directly or indirectly to die interconnects 118 to couple the DSC 104 to the die 108. The embedded DTC 106 is embedded in the package substrate 110 of the IC package 100. The embedded DTC 106 is also electrically coupled to the die 108 by the embedded DTC 106 being coupled to metal interconnects 126 that are coupled to metal lines 128 in a metallization layer(s) of the package substrate 110. The metal lines 128 are coupled directly or indirectly to the die interconnects 118 to couple the embedded DTC 106 to the die 108.

Figure 1B:
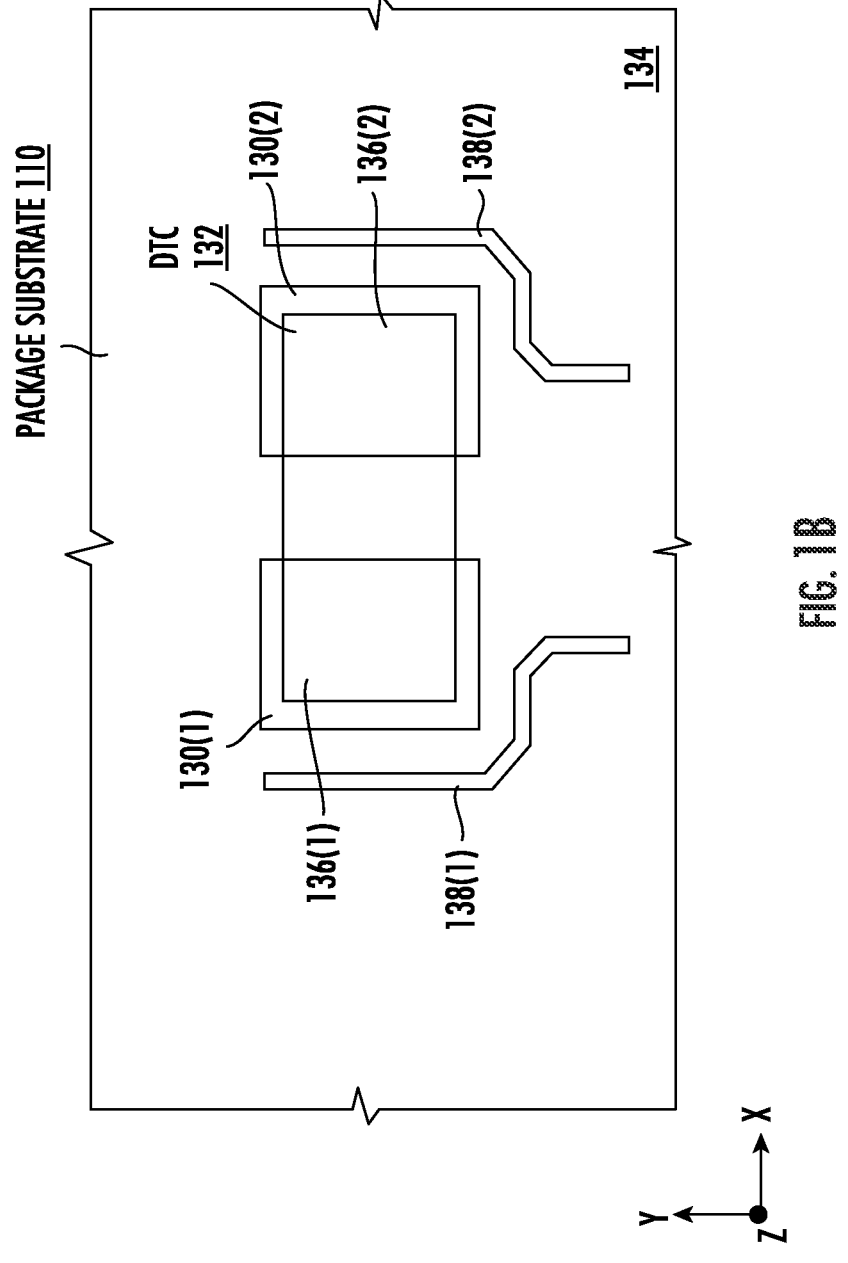
FIG. 1B is a top view of the package substrate in FIG. 1A illustrating capacitor pads of a DTC coupled to metal interconnects in an outer metallization layer of the package substrate, to couple the DTC to the outer metallization layer of the package substrate, and further illustrating signal traces routed around the capacitor pads.

FIG. 1B is a top view of the package substrate 110 in FIG. 1A illustrating metal capacitor pads 130(1), 130(2) of a DTC 132 coupled to an outer metallization layer 134 of the package substrate 110 to couple the DTC 132 to the package substrate 110. The DTC 132 can be the LSC 102, DSC 104, or embedded DTC 106 in the IC package 100 in FIG. 1A as examples. Metal interconnects 136(1), 136(2) in the form of metal pads are exposed through openings in a solder resist layer of the outer metallization layer 134. In this manner, when the capacitor pads 130(1), 130(1) of the DTC 132 are aligned in the vertical direction (Z-axis direction) over the metal interconnects 136(1), 136(2) and coupled thereto, the DTC 132 is electrically coupled to the package substrate 110. As discussed above, metal lines in the package substrate 110 coupled to the metal interconnects 136(1), 136(2) can be routed and coupled to metal interconnects coupled to die interconnects 118 of the die 108 as shown in FIG. 1A, to couple the DTC 132 to the die 108.

With continuing reference to FIG. 1B, the metal interconnects 136(1), 136(2) and metal lines in the package substrate 110 beneath the capacitor pads 130(1), 130(2) that provide the signal path for the DTC 132 consumes space in the package substrate 110 in the vertical direction (Z-axis direction). This space may be consumed in not only the outer metallization layer 134 of the package substrate 110, but also in areas in additional metallization layers beneath the outer metallization layer 134 beneath the DTC 132. This may in effect provide a "keep out zone" in the package substrate 110 in the areas consumed by DTC 132 in which other signal paths provided in the package substrate 110 unrelated to the connection to the DTC 132 cannot invade. Thus, as shown in FIG. 1B, metal lines 138(1), 138(2) for other signal paths in the package substrate 110 nearby the metal interconnects 136(1), 136(2) for the DTC 132 are routed in the package substrate 110 around the lateral areas of the DTC 132. This causes the signal carried over these metal lines 138(1), 138(2) to be longer in length, thereby increasing signal path resistance resulting in additional signal delay in such signals. This also leads to less efficient signal routing and use of routing space in the package substrate 110. This could lead to an increase in number of metallization layers needed in the package substrate 110 to provide sufficient signal routing, thereby adding area and cost to the package substrate 110.

Figure 2:
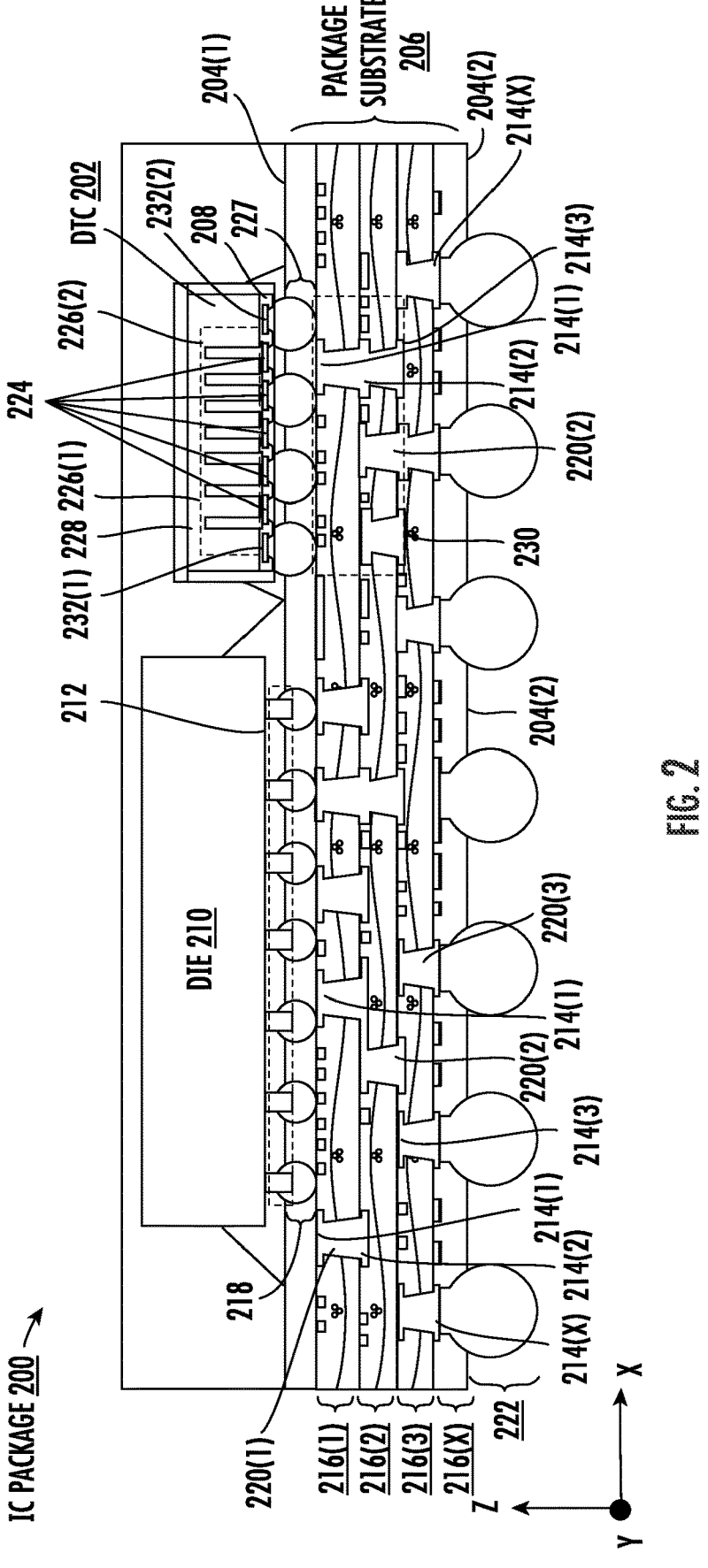
FIG. 2 is a side view of another IC package that includes a DTC in the form of a DSC that includes additional metal interconnects interconnected to each other by metal lines in the outer metallization layer of the DTC, to provide bypass signal routes through the DTC.

FIG. 2 is a side view of an exemplary IC package 200 that includes a DTC 202 in the form of a DSC attached to a first, die side 204(1) of a package substrate 206. As discussed in more detail below, the DTC 202 employs a bypass metal trace signal routing in an outer metallization layer 208 of the DTC 202 to support signal bypass routing through the DTC 202. In this manner, the DTC 202 supports routing of signals through the DTC 202 without such signals necessarily having to be routed around the DTC 202.

In this regard, the IC package 200 in FIG. 2 includes a semiconductor die ("die") 210 coupled to the first side 204(1) of the package substrate 206. The die 210 includes die interconnects 212 (e.g., metal pads) coupled to metal interconnects 214(1) (e.g., metal traces, metal lines) in an outer metallization layer 216(1) of the package substrate 206 through external metal bumps 218 (e.g., solder bumps, solder joints, ball grid array (BGA) interconnects, micro-bumps). The package substrate 206 in this example also includes additional metallization layers 216(2)-216(X) that each have respective metal interconnects 214(2)-214(X) (e.g., metal traces, metal lines) interconnected by respective vias 220(1)-220(3) (e.g., metal posts). In this manner, signals can be routed to the die 210 through signal routing between the metal interconnects 214(1)-214(X) coupled by vias 220(1)-220(3) in the metallization layers 216(1)-216(X) in the package substrate 206. A second, outer metallization layer 216(X) that provides a second side 204(2) of the package substrate 206 opposite the first side 204(1) of the package substrate 206 in the vertical direction (Z-axis direction) supports external interconnects 222 (e.g., solder balls, BGA interconnects) for providing an external interface to the package substrate 206 and the die 210 in the IC package 200.

With continuing reference to FIG. 2, like die 210, the DTC 202 is also coupled to the outer metallization layer 216(1) of the package substrate 206 in this example. The DTC 202 includes metal contacts 224 (e.g., metal pads) that are coupled to metal interconnects 214(1) (e.g., metal traces, metal lines) in an outer metallization layer 216(1) of the package substrate 206 through external metal bumps 227 (e.g., solder bumps, solder joints, ball grid array (BGA) interconnects) to couple the capacitor(s) in the DTC 202 to the package substrate 206. The metal contacts 224 are disposed in the outer metallization layer 208 of the DTC 202 adjacent to the first surface 204(1) of package substrate 206 in this example. The metal contacts 224 are coupled to conductive layers of capacitors 226(1), 226(2) in the DTC 202 that are disposed in trenches formed in a substrate 228 of the DTC 202. An advantage of the DTC 202 is that it can be coupled to the package substrate 206 closer to the die 210 to reduce resistive losses. The DTC 202 can also be fabricated separately like a semiconductor device, and then picked, placed on, and coupled to the package substrate 206 like the die 210 in the fabrication of the IC package 200. By coupling the DTC 202 to the package substrate 206, the capacitors 226(1), 226(2) in the DTC 202 can be electrically coupled to the package substrate 206 through the coupling of the metal contacts 224 to metal interconnects 214(1) in the outer metallization layer 216(1) through the metal bumps 227. The capacitors 226(1), 226(2) can be coupled to the die 210 through the package substrate 206 to be coupled to circuits in the die 210, such as to provide a filtering component or as part of a power distribution network (PDN) for the die 210. The metal interconnects 214(1) in the outer metallization layer 216(1) that are coupled to the DTC 202 may form a keep-out-zone (KoZ) 230 in the package substrate 206 in which other metal lines for routing other signals may have to avoid and be routed around in the horizontal plane (X- and Y-axis plane) to avoid interfering with the signal routing in the package substrate 206 for the DTC 202.

As discussed in more detail below, in this example, to provide bypass signal routing in the DTC 202, the DTC 202 in this example also includes additional, second metal contacts 232(1), 232(2). Like the metal contact 224, the additional, second metal contacts 232(1), 232(2) are also disposed in the outer metallization layer 208 of the DTC 202. In this example, the second metal contacts 232(1), 232(2) are not coupled to the capacitors 226(1), 226(1). Instead, the second metal contacts 232(1), 232(2) are coupled to each side of a metal line (e.g., a metal trace) that is disposed in the outer metallization layer 208 to provide a signal routing path between the second metal contacts 232(1), 232(2). If it is desired to route a signal in a metallization layer 216(1)-216(X) of the package substrate 206 that goes through the KoZ 230 for the DTC 202 in the package substrate 206, a metal interconnect 214(1)-214(X) for such routed signal can be coupled to a second metal contact 232(1) of the DTC 202 by it being coupled to a metal bump 227 that is coupled to the second metal contact 232(1). The other second metal contact 232(2) can then be coupled to a metal interconnect 214(1)-214(X) by its coupled metal bump 227 being coupled to such metal interconnect 214(1)-214(X) to continue carrying the signal in the package substrate 206. The metal line that is disposed in the outer metallization layer 208 of the DTC 202 and that couples the second metal contacts 232(1), 232(2) to each other provides a signal routing path through the DTC 202 in an area that would normally otherwise be part of the KoZ 230 of the package substrate 206. In other words, in the DTC 202, the second metal contacts 232(1), 232(2) and coupled metal line to the second metal contracts 232(1), 232(2) provide a signal routing bypass that allows a signal to be routed from the package substrate 206 up and through the DTC 202 and then back down and continue in the package substrate 206. This is opposed to having to route such signal paths laterally around the DTC 202 (in the X- and Y-axis directions) and outside of the KoZ 230 in the package substrate 206 for more efficient signal routing.

Figure 3:
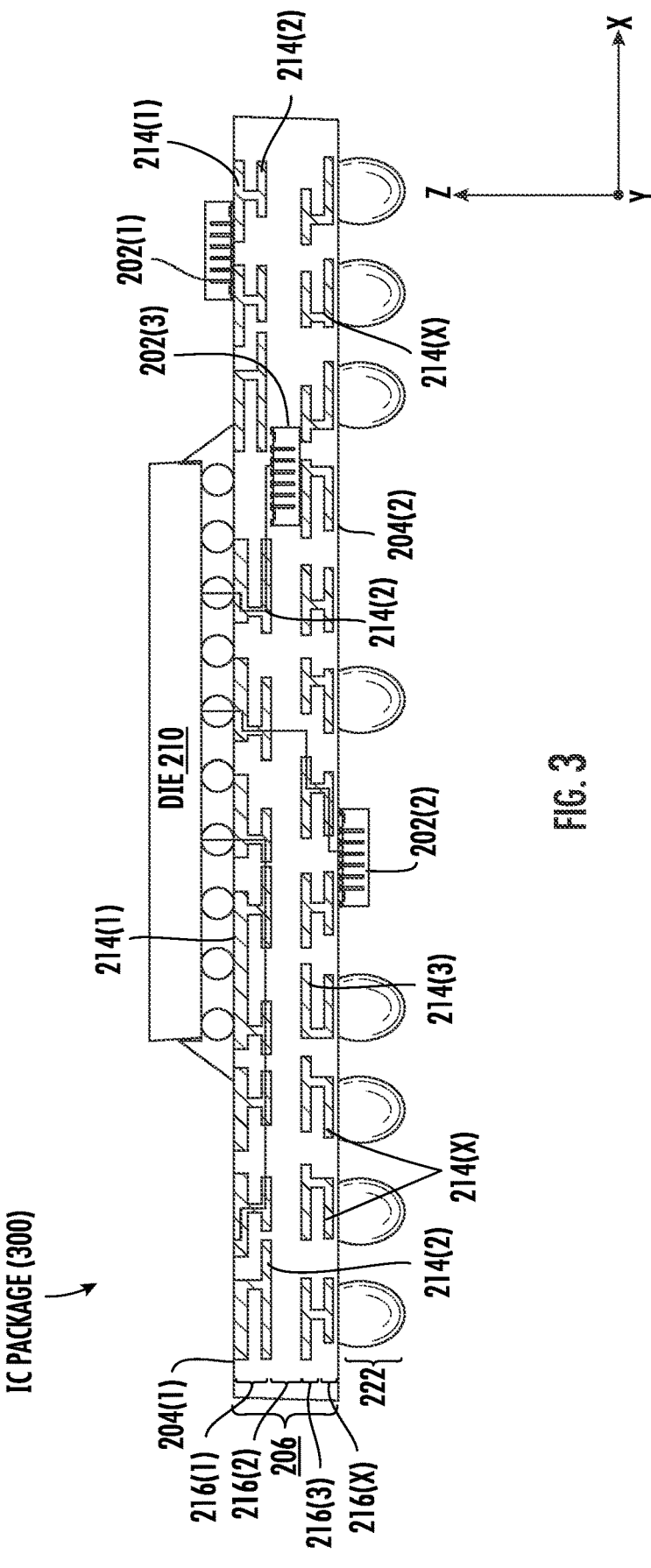
FIG. 3 is a side view of another IC package that includes a package substrate with deep trench capacitors (DTCs) that include a land-side capacitor (LSC), a die-side capacitor (DSC), and embedded DTC, wherein the DTCs have an outer metallization layer that includes additional metal interconnects interconnected to each other by metal lines in the outer metallization layer of the DTC to provide bypass signal routes through the DTC.

FIG. 3 is a side view of another IC package 300 that includes the package substrate 206 in the IC package 200 in FIG. 2 to illustrate exemplary possibilities for coupling locations of DTCs, like DTC 202 in FIG. 2, to the package substrate 206. The IC package 300 in this example includes DTCs 202(1)-202(3) that are like the DTC 202 in FIG. 2. Like DTC 202 in FIG. 2, the DTCs 202(1)-202(3) each have the outer metallization layer 208 that includes additional metal contacts 232(1), 232(2) interconnected to each other by a metal line in the outer metallization layer 208 of the to a provide bypass signal route(s) through the DTC 202(1)-202(3). As shown in FIG. 3, DTC 202(1) is a DSC that is coupled to the first, die side 204(1) of the package substrate 206 like in the IC package 200 in FIG. 2. DTC 202(2) is a LSC that is coupled to the second side 204(2) of the package substrate 206. DTC 202(2) is an embedded DTC that is embedded inside metallization layers 216(1)-216(X) of the package substrate 206. In each of the examples of DTCs 202(1)-202(3) in FIG. 3, the second metal contacts 232(1) 232(2) can then be coupled to a metal interconnect 214(1)-214(X) of the package substrate 206 to continue carrying a signal in the package substrate 206 that is routed through the respective DTC 202(1)-202(3).

Figure 4A:
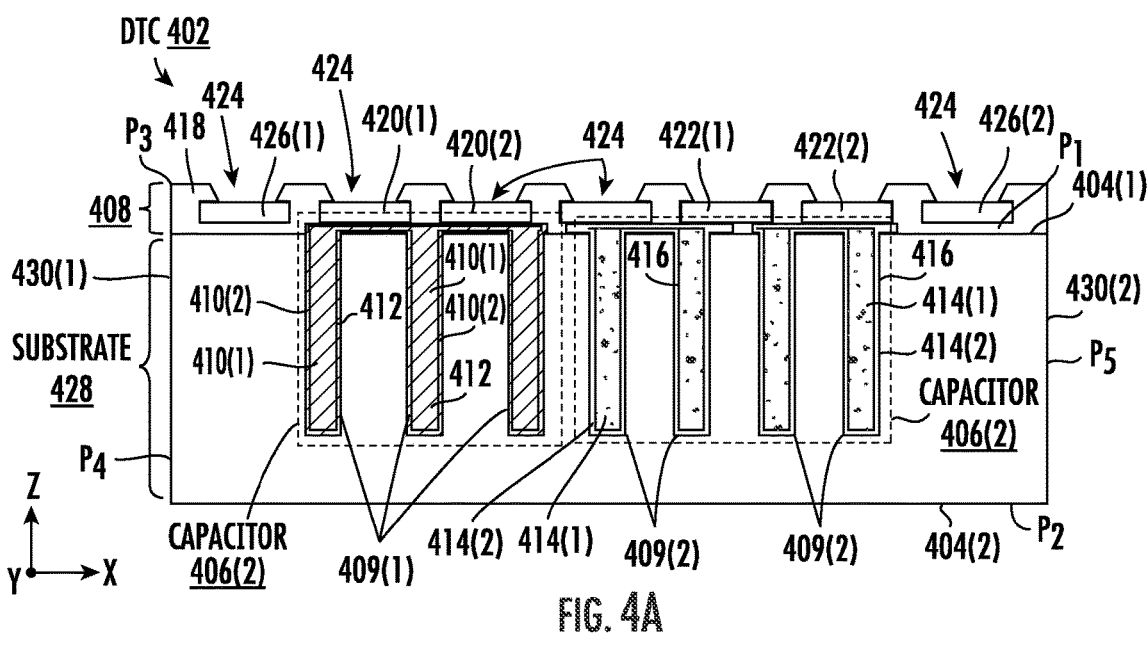
FIG. 4A is a side view of an exemplary DTC that includes an outer metallization layer with metal interconnects coupled to metal contacts (i.e., terminals) of capacitors formed in trenches in a substrate, and wherein the outer metallization layer also includes additional metal interconnects interconnected to each other by metal lines in the outer metallization layer of the DTC to provide bypass signal routes through the DTC.
Figure 4B:
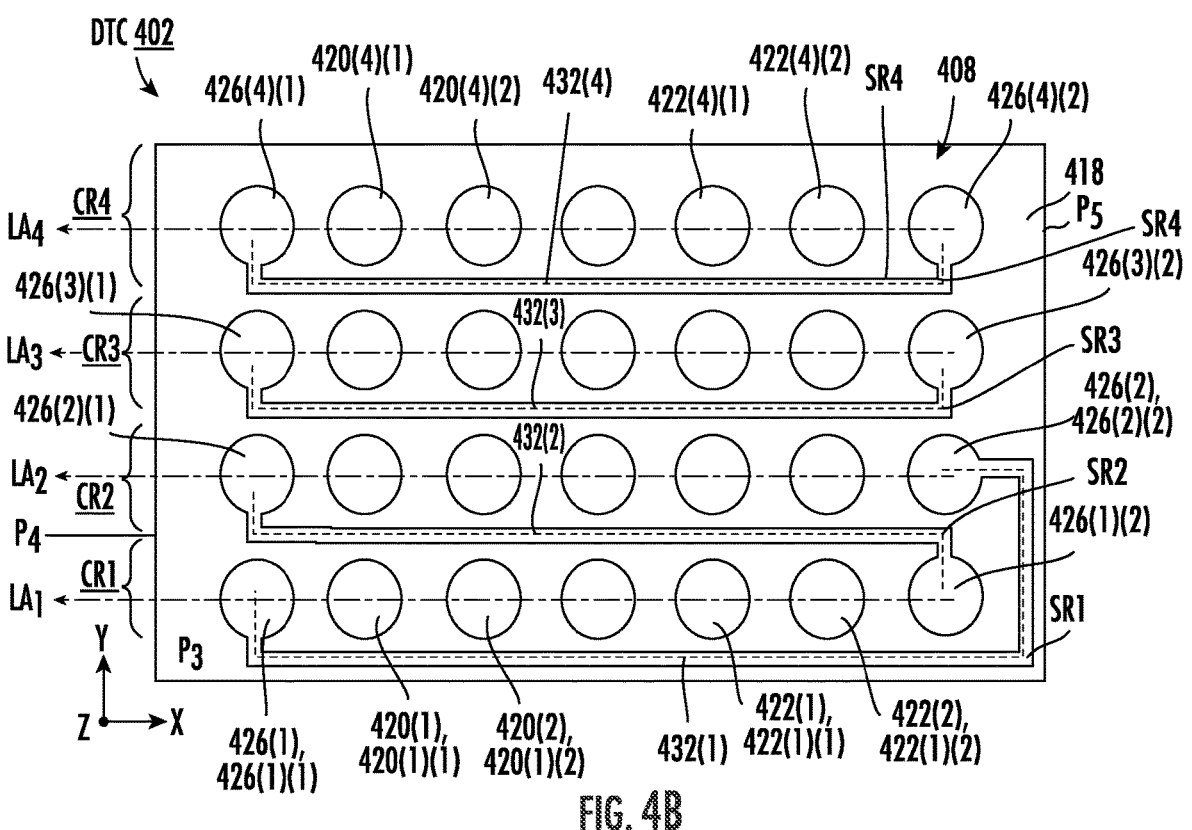
FIG. 4B is a top view of the outer metallization layer in the DTC in FIG. 4A, illustrating metal interconnects coupled to the capacitor metal contacts, and additional metal interconnects coupled to each other by metal lines formed in the outer metallization layer to provide bypass signal routes through the DTC.

To illustrate additional exemplary detail of a DTC that includes additional metal interconnects interconnected to each other by metal lines in an outer metallization layer of the DTC to provide bypass signal routes through the DTC, FIGS. 4A and 4B are provided. FIG. 4A is a side view of an exemplary DTC 402 that can be included as the DTC 202 in the IC package 200 in FIG. 2 and any of the DTCs 202(1)-202(3) in the IC package 300 in FIG. 3. FIG. 4B is a top view of an outer metallization layer 408 in the DTC 402 in FIG. 4A. FIGS. 4A and 4B will be discussed in conjunction to describe the exemplary DTC 402 therein.

In this regard, as shown in FIG. 4A, the DTC 402 includes a substrate 428, that may be a semiconductor substrate such as a silicon substrate. The substrate 428 has a first surface 404(1) and a second surface 404(2) opposite the first surface 404(1) in the vertical direction (Z-axis direction). The first and second surfaces 404(1), 404(2) of the substrate 428 are disposed in respective horizontal planes $P_1$, $P_2$ (X-Y axes plane). In FIG. 4A, the first surface 404(1) is above the second surface 404(2) in the vertical direction (Z-axis direction). The DTC 402 includes a first and second capacitors 406(1), 406(2) disposed in respective trenches 409(1), 409(2) that are disposed in the substrate 428. The first capacitor 406(1) includes a first and second conductive layers 410(1), 410(2) separated by a dielectric material 412. The first and second conductive layers 410(1), 410(2) of the first capacitor 406(1) are disposed in the substrate 428 between the first surface 404(1) and the second surface 404(2) of the substrate 428. The second capacitor 406(2) includes a first and second conductive layers 414(1), 414(1) separated by a dielectric material 416. The first and second conductive layers 414(1), 414(2) of the second capacitor 406(2) are disposed in the substrate 428 between the first surface 404(1) and the second surface 404(2) of the substrate 428.

With continuing reference to FIG. 4A, the DTC 402 also includes the outer metallization layer 408 that is disposed adjacent to the first surface 404(1) of the substrate 428. The outer metallization layer 408 is disposed in a third horizontal plane $P_3$ (in an X- and Y-axes plane) orthogonal the horizontal planes $P_1$, $P_2$. The outer metallization layer 408 includes an insulating layer 418 made of a dielectric material in this example. The insulating layer 418 insulates the first and second capacitors 406(1), 406(2). For example, the insulating layer 418 may be made out of a solder resist material and be a solder resist layer. First and second metal contacts 420(1), 420(2) are disposed in the insulating layer 418 adjacent to the first surface 404(1) and coupled to the respective first and second conductive layers 410(1), 410(1) of the first capacitor 406(1). The first and second metal contacts 420(1), 420(2) provide an external interface to the first capacitor 406(1) when the DTC 402 is coupled to another contact, such as the outer metallization layer 208 in the IC packages 200, 300 in FIGS. 2 and 3. Third and fourth metal contacts 422(1), 422(2) are also disposed in the insulating layer 418 adjacent to the first surface 404(1) and coupled to the respective first and second conductive layers 414(1), 414(1) of the second capacitor 406(2). The third and fourth metal contacts 422(1), 422(2) provide an external interface to the second capacitor 406(2) when the DTC 402 is coupled to another contact, such as the outer metallization layer 208 in the IC packages 200, 300 in FIGS. 2 and 3. Openings 424 are formed in the insulating layer 418 to expose the metal contacts 420(1), 420(2), 422(1), 422(2) to allow metal interconnects (e.g., solder balls) to be formed in the openings 424 are coupled to the metal contacts 420(1), 420(2), 422(1), 422(2).

With continuing reference to FIG. 4A, to provide a bypass signal routing path through the DTC 402, additional metal contacts 426(1), 426(2) are also formed in the insulating layer 418. In this example, the additional metal contacts 426(1), 426(2) are not coupled to the capacitors 406(1), 406(2) (via their metal contacts 420(1), 420(2), 422(1), 422(2)). The additional metal contacts 426(1), 426(2) are formed adjacent to the outer sides 430(1), 430(2) of the substrate 428 in this example, such that the first and second capacitors 406(1), 406(2) are disposed in the substrate 428 between the additional metal contacts 426(1), 426(2) in the horizontal direction (X- and Y-axes directions). The outer sides 430(1), 430(2) of the substrate 428 are disposed in respective vertical planes $P_4$, $P_5$ (Y- and Z-axes plane) orthogonal to the horizontal planes $P_1$, $P_2$ of the first and second surfaces 404(1), 404(2) of the substrate 428. As shown in the top view of the DTC 402 and its outer metallization layer 408 in FIG. 4B, a metal line 432(2) (e.g., a metal trace) is formed in the insulating layer 418 that couples the additional metal contacts 426(1), 426(2) together. The openings 424 are also formed in the insulating layer 418 to expose the additional metal contacts 426(1), 426(2) to allow metal interconnects (e.g., solder balls) to be formed in the openings 424 are coupled to the additional metal contacts 426(1), 426(2). In this manner, if it is desired to provide a signal routed through the DTC 402, a circuit can be coupled to the additional metal contacts 426(1), 426(2) co that provide a signal routing path from additional metal contact 426(1) to additional metal contact 426(2), which extends through the insulating layer 418 of the metallization layer 408 through the DTC 402.

As an example, the outer metallization layer 408 may be a re-distribution layer (RDL). The outer metallization layer 408 includes the metal contacts 420(1), 420(2), 422(1), 422(2), 426(1), 426(2) that are formed and re-distributed in different areas of the insulating layer 418 to provide metal interfaces to the DTC 402 in desired locations in the horizontal plane $P_3$ of the metallization layer 408.

FIG. 4B is a top view of the DTC 402 in FIG. 4A. As shown in FIG. 4B, metal contact can be formed in two (2) dimensions (X- and Y-axes dimensions) to provide an interface to the first and second capacitors 406(1), 406(2) and to provide additional bypass signal routing paths through the DTC 402. In this regard, as shown in FIG. 4B, metal contacts are formed in the outer metallization layer 408 in a plurality of contact rows CR(1)-CR(4). Note that the example could include more or less contact rows. Each contact row CR(1)-CR(4) has respective metal contacts 420(1)(1), 420(1)(2)-420(4)(1), 420(4)(2) coupled to the first capacitor 406(1) in this example (FIG. 4A). Each contact row CR(1)-CR(4) also has respective metal contacts 422(1)(1), 422(1)(2)-422(4)(1), 422(4)(2) coupled to the second capacitor 406(2) in this example (FIG. 4A). Each contact row CR(1)-CR(4) also has respective additional metal contacts 426(1)(1), 426(1)(2)-426(4)(1), 426(4)(2) to provide bypass signal routing paths through the DTC 402. The metal contacts 420(1)(1), 420(1)(2)-420(4)(1), 420(4)(2); 422(1)(1), 422(1)(2)-422(4)(1), 422(4)(2); 426(1)(1), 426(1)(2)-426(4)(1), 426(4)(2) in each respective contact row CR1-CR4 are aligned along respective longitudinal axes $LA_1$-$LA_4$ in the horizontal (X-axis direction).

In this example, by providing four (4) contact rows CR(1)-CR(4), four (4) bypass signal routing paths can be provided. In this regard, each contact row CR(1)-CR(4) includes the respective additional metal contacts 426(1)(1), 426(1)(2)-426(4)(1), 426(4)(2). The metal contact 426(1)(1) in the first contact row CR1 is coupled to the first metal line 432(1) formed in the insulating layer 418, wherein the first metal line 432(1) is coupled to metal contact 426(2)(1) in the second contact row CR2. The first metal line 432(1) extends along the longitudinal axis $LA_1$ in the horizontal direction (X-axis direction) adjacent to the first contact row CR1. The first metal line 432(1) forms a first bypass signal route SR1 through the DTC 402 between metal contacts 426(1)(1), 426(2)(1). Metal contact 426(2)(1) in the second contact row CR2 is coupled to a second metal line 432(2) formed in the insulating layer 418, wherein the second metal line 432(2) is coupled to metal contact 426(1)(1) in first contact row CR1. The second metal line 432(2) extends along the longitudinal axis $LA_2$ in the horizontal direction (X-axis direction) between the first and second contact rows CR1, CR2. The second metal line 432(2) forms a second bypass signal route SR2 through the DTC 402 between metal contacts 426(2)(1), 426(1)(2). Metal contact 426(3)(1) in the third contact row CR3 is coupled to a third metal line 432(3) formed in the insulating layer 418, wherein the third metal line 432(3) is coupled to metal contact 426(3)(2) in the third contact row CR3. The third metal line 432(3) extends along the longitudinal axis $LA_3$ in the horizontal direction (X-axis direction) between the second and third contact rows CR2, CR3. The third metal line 432(3) forms a third bypass signal route SR3 through the DTC 402 between metal contacts 426(3)(1), 426(3)(2). Metal contact 426(4)(1) in the fourth contact row CR4 is coupled to a fourth metal line 432(4) formed in the insulating layer 418, wherein the fourth metal line 432(4) is coupled to metal contact 426(4)(2) in the fourth contact row CR4. The fourth metal line 432(4) extends along the longitudinal axis $LA_3$ in the horizontal direction (X-axis direction) between the third and fourth contact rows CR3, CR4. The fourth metal line 432(4) forms a fourth bypass signal route SR4 through the DTC 402 between metal contacts 426(4)(1), 426(4)(2).

As shown in FIG. 4B and discussed above, first metal contacts 426(1)(1), 426(2)(1), 426(3)(1), 426(4)(1) in respective contact rows CR1-CR4 can be coupled to second metal contacts 426(1)(2), 426(2)(2), 426(3)(2), 426(4)(2) in the same contact row CR1-CR4 or different contact rows CR1-CR4. For example, metal contacts 426(3)(1), 426(4)(1) in the third and fourth contact rows CR3, CR4 are coupled to respective metal contacts 426(3)(2), 426(4)(2) in the same respective third and fourth contact rows CR3, Cr4. However, metal contacts 426(1)(1), 426(2)(1) in the respective first and second contact rows CR1, CR2 are coupled to respective second and first metal contacts 426(2)(2), 426(1)(2) in the respective second and first contact rows CR2, CR1.

Figures 5A, 5B, 5C:
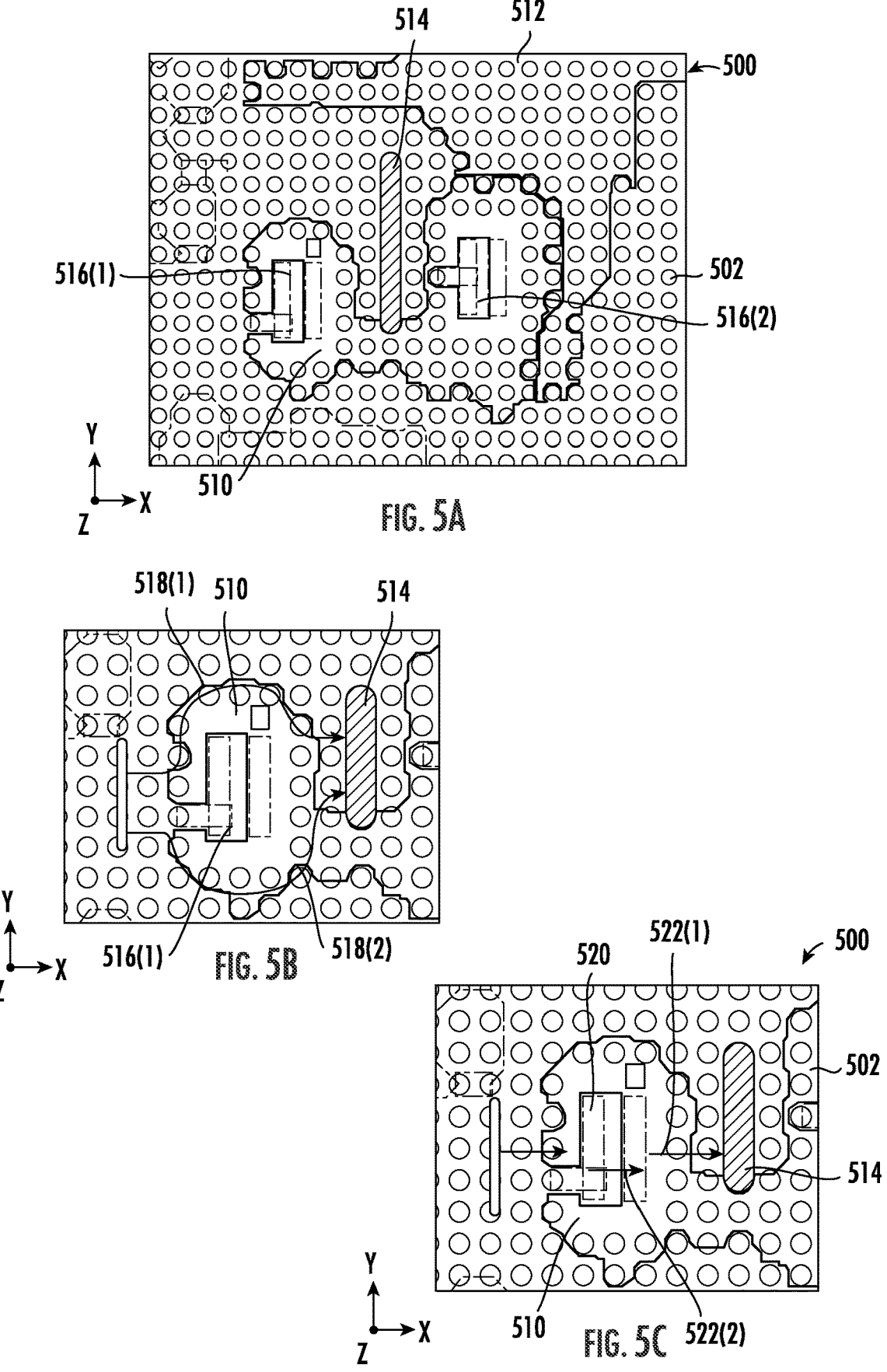
FIG. 5A is a bottom view of an outer metallization layer of an exemplary package substrate showing metal interconnects configured to be coupled to a DTC and a metal signal routing around the DTC.
FIG. 5B is a close-up view of FIG. 5A.
FIG. 5C is a bottom view of another outer metallization layer of an exemplary package substrate showing signal routing through the DTC that includes an outer metallization layer that includes additional metal interconnects interconnected to each other by metal lines to provide bypass signal routes through the DTC.

To illustrate additional detail on the benefit of a DTC, such as the DTCs 202, 202(1)-202(3), and 402 in FIGS. 2-4B that includes additional metal interconnects formed in a metallization layer and interconnected to each other by metal lines in the outer metallization layer to provide bypass signal routes through the DTC, FIGS. 5A-5C are provided. FIG. 5A is a bottom view of an outer metallization layer 500 of an exemplary package substrate 502 showing metal interconnects 510, 512. As shown in FIG. 5A and a close-up view in FIG. 5B, metal interconnect 510 is coupled to an external interconnect 514 provides a signal routing path that extends around two DTCs 516(1), 516(2) in a horizontal direction (X- and Y-axis directions). The DTCs 516(1), 516(2) in this example do not include additional metal interconnects formed in a metallization layer and interconnected to each other by metal lines in the outer metallization layer to provide bypass signal routes through the DTCs 516(1), 516(2). This causes the signal routing paths 518(1), 518(2) provided in metal interconnect 510 to be routed around the DTC 516(1), thus extending the length of the signal routing paths 518(1), 518(2). However, as shown in FIG. 5C, if a DTC 520 that includes additional metal interconnects formed in a metallization layer and interconnected to each other by metal lines in the outer metallization layer to provide bypass signal routes through the DTC 520 is coupled to the package substrate 502, signal routing paths 522(1), 522(2) can be provided that extend through the DTC 520.

Figure 6:
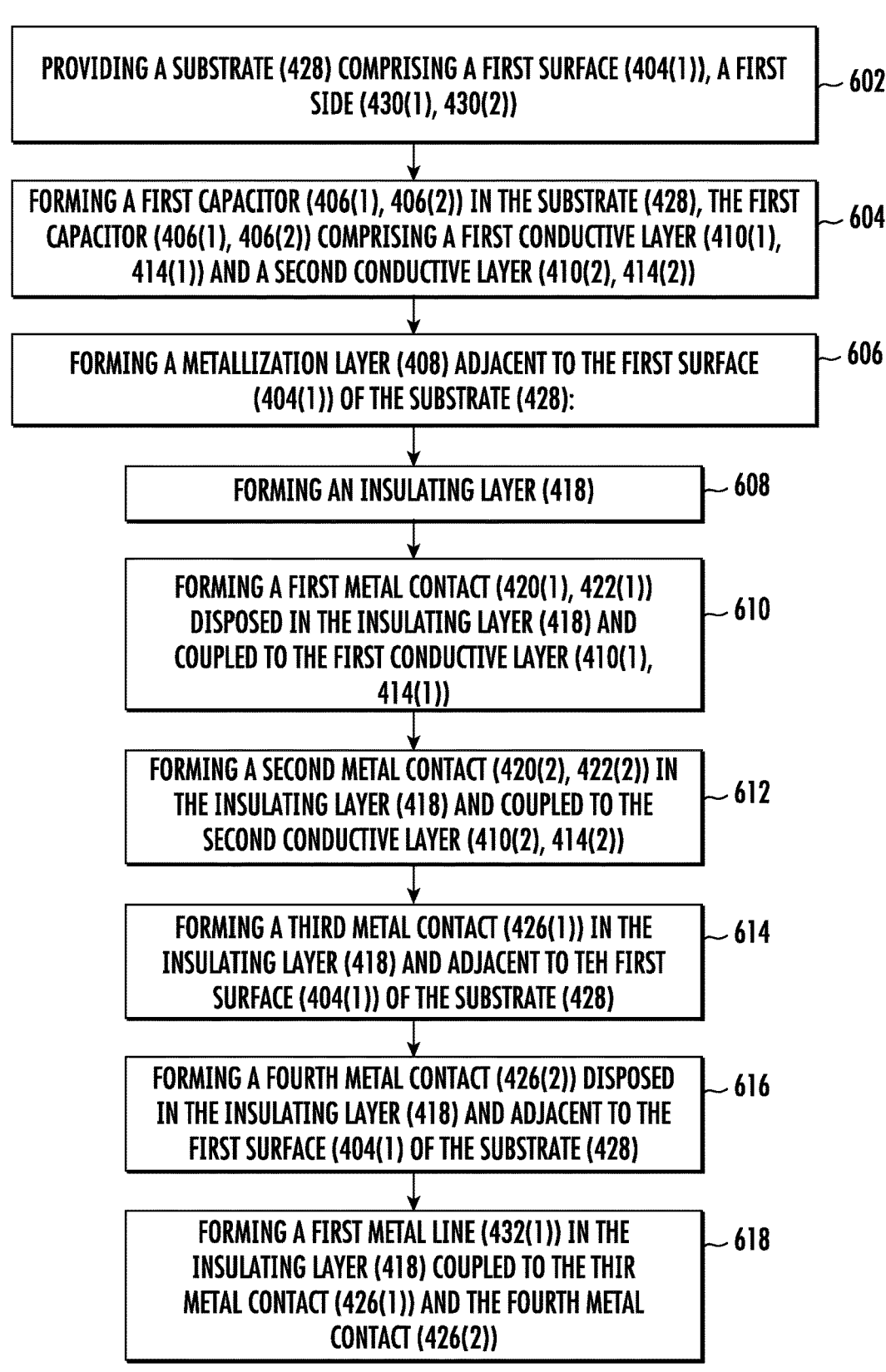
FIG. 6 is a flowchart illustrating an exemplary fabrication process of fabricating a DTC that includes additional metal interconnects interconnected to each other by metal lines in the outer metallization layer of the DTC to provide bypass signal routes through the DTC, including but not limited to the DTCs in FIGS. 2-4B and 5C.

Fabrication processes can be employed to fabricate a DTC that includes additional metal interconnects formed in a metallization layer and interconnected to each other by metal lines in the outer metallization layer to provide bypass signal routes through the DTC, including but not limited to the DTCs 202, 202(1)-202(3), 402, 520 in FIGS. 2-4B and 5C. In this regard, FIG. 6 is a flowchart illustrating an exemplary fabrication process 600 of fabricating a DTC that includes additional metal interconnects interconnected to each other by metal lines in the outer metallization layer of the DTC to provide bypass signal routes through the DTC, including but not limited to the DTCs 202, 202(1)-202(3), 402, 520 in FIGS. 2-4B and 5C. The fabrication process 600 in FIG. 6 is discussed with regard to the DTC 402 in FIGS. 4A and 4B, but note that the fabrication process 600 is not limited to fabricating a DTC like the DTC 402 in FIGS. 4A and 4B.

In this regard, as shown in FIG. 6, a first step of the fabrication process 600 in this example is providing a substrate 428 comprising a first surface 404(1), a first side 430(1), 430(2), and a second surface 404(2) opposite the first surface 404(1) (block 602 in FIG. 6). A next step of the fabrication process 600 is forming a first capacitor 406(1), 406(2) in the substrate 428, the first capacitor 406(1), 406(2) comprising a first conductive layer 410(1), 414(1) and a second conductive layer 410(2), 414(2) (block 604 in FIG. 6). A next step of the fabrication process 600 is forming a metallization layer 408 adjacent to the first surface 404(1) of the substrate 428 (block 606 in FIG. 6). A first step in forming the metallization layer 408 can be forming an insulating layer 418 (block 608 in FIG. 6). A next step in forming the metallization layer 408 can be forming a first metal contact 420(1), 422(1) disposed in the insulating layer 418 and coupled to the first conductive layer 410(1), 414(1) (block 610 in FIG. 6). A next step in forming the metallization layer 408 can be forming a second metal contact 420(2), 422(2) in the insulating layer 418 and coupled to the second conductive layer 410(2), 414(2) (block 612 in FIG. 6). A next step in forming the metallization layer 408 can be forming a third metal contact 426(1) in the insulating layer 418 and adjacent to the first surface 404(1) of the substrate 428 (block 614 in FIG. 6). A next step in forming the metallization layer 408 can be forming a fourth metal contact 426(2) disposed in the insulating layer 418 and adjacent to the first surface 404(1) of the substrate 428 (block 616 in FIG. 6). A next step in forming the metallization layer 408 can be forming a first metal line 432(1) in the insulating layer 418 coupled to the third metal contact 426(1) and the fourth metal contact 426(2) (block 618 in FIG. 6).

Figures 7A, 8A, 8B, 8C:
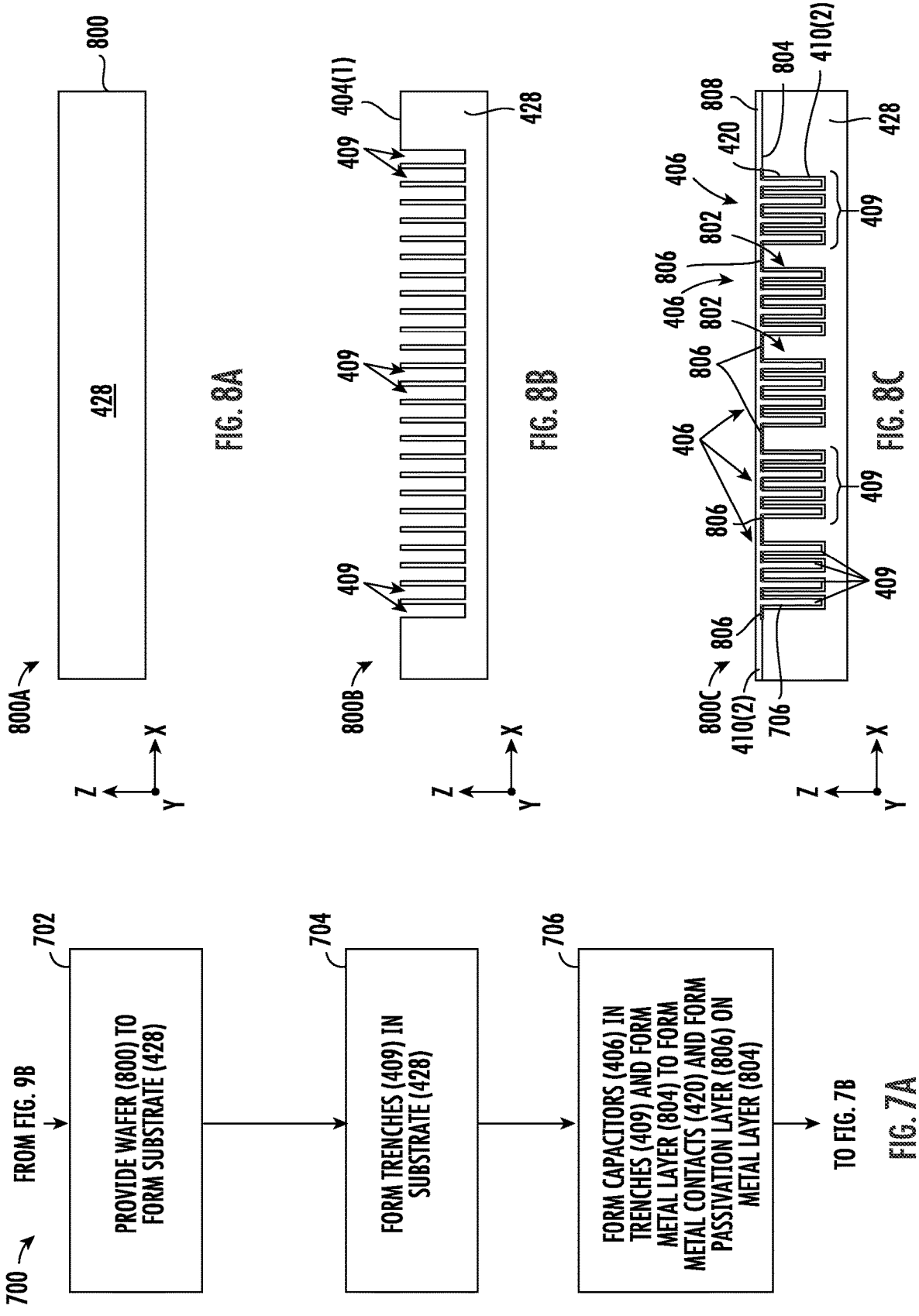
Figures 7C, 8G, 8H:
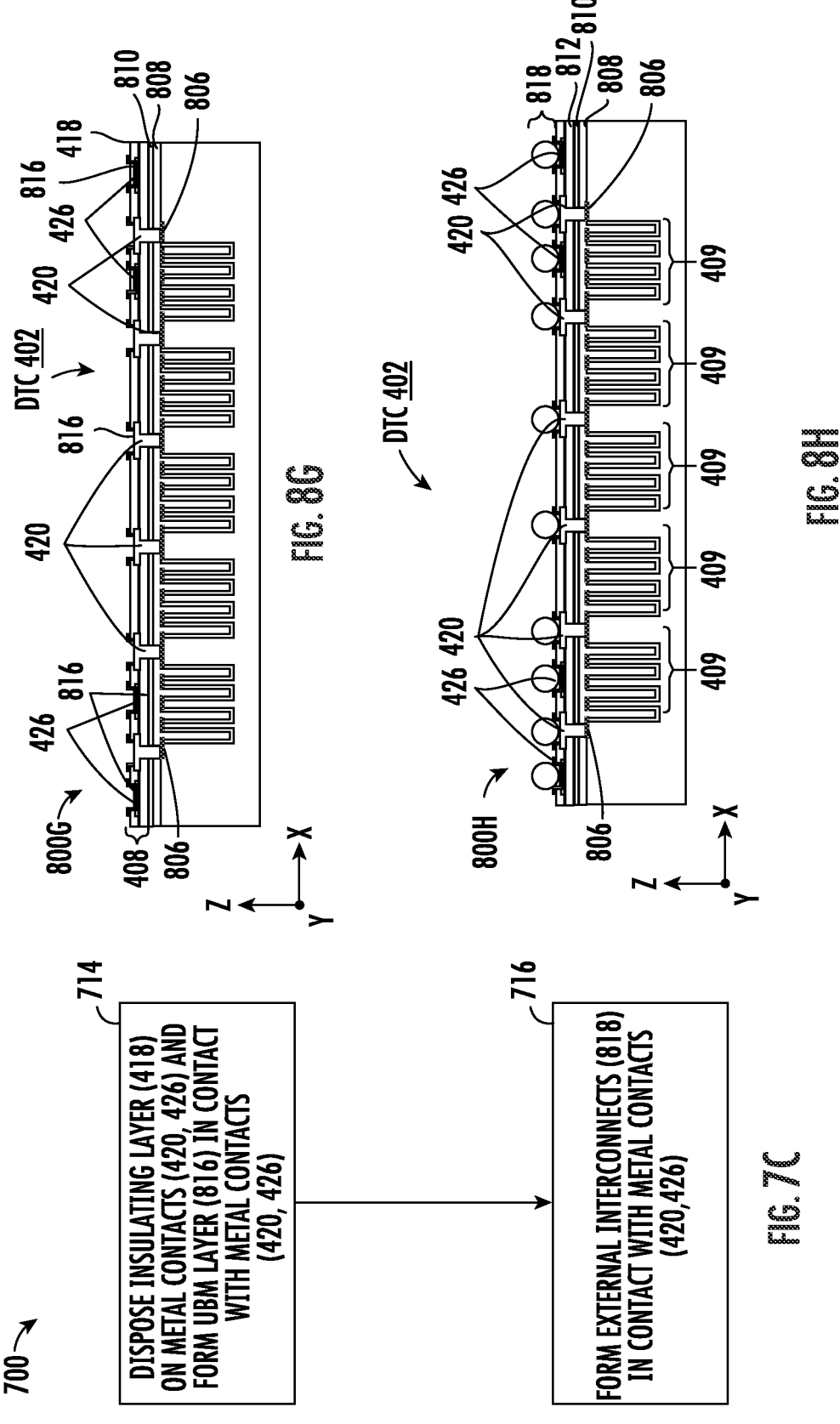

Other fabrication processes can also be employed to fabricate a DTC that includes additional metal interconnects formed in a metallization layer and interconnected to each other by metal lines in the outer metallization layer to provide bypass signal routes through the DTC, including but not limited to the DTCs 202, 202(1)-202(3), 402, 520 in FIGS. 2-4B and 5C. In this regard, FIGS. 7A-7C is a flowchart illustrating another exemplary fabrication process 700 of fabricating a DTC that includes additional metal interconnects formed in a metallization layer and interconnected to each other by metal lines in the outer metallization layer to provide bypass signal routes through the DTC, including but not limited to the DTCs 202, 202(1)-202(3), 402, 520 in FIGS. 2-4B and 5C. FIGS. 8A-8H are exemplary fabrication stages 800A-800H during fabrication of the DTC according to the fabrication process 700 in FIGS. 7A-7C. The fabrication process 700 in FIGS. 7A-7C, and as shown in the fabrication stages 800A-800H in FIGS. 8A-8H, are discussed in reference to the DTC 402 in FIGS. 4A and 4B, but note that such is not limiting.

In this regard, as shown in the fabrication stage 800A in FIG. 8A, a first step in fabricating the DTC 402 is to provide the substrate 428 for the DTC 402 (block 702 in FIG. 7A). The substrate 428 is formed from a semiconductor material in which the trenches 409 will be formed for disposing conductive layers in the trenches with an intermediate dielectric layer to form capacitors. For example, the substrate 428 may be a silicon material. The substrate 428 may also be provided as a wafer 800 so that multiple DTCs 402 can be formed in the wafer 800 at the same time in the fabrication process 700 and then singulated in later fabrication process. Note that only one DTC 402 is illustrated as being formed from the substrate 428 in the fabrication process 700 in FIGS. 7A-7C in this example, but such is not limiting. As shown in the fabrication stage 800B in FIG. 8B, a next step in the fabrication process 700 is to form trenches 409 in the substrate 428 so that conductive layers can be disposed in the trenches 409 to form capacitors (block 704 in FIG. 7A). The trenches 409 can be formed by etching into the first surface 404(1) of the substrate 428 and etching down into the substrate 428 to a desired depth.

Then, as shown in the fabrication stage 800C in FIG. 8C, a next step in the fabrication process 700 is to form the capacitors 406 in the trenches 409 formed in the substrate 428 (block 706 in FIG. 7A). To form the capacitors 406, a doped conductive region 802 of a second conductivity type (e.g., p+) of opposite polarity from the first conductivity type can be disposed in the trenches 409 as an example. A second conductive layer 410(2) is disposed on the doped conductive region 802 in the trenches 409. A dielectric material 412 is then disposed on the second conductive layer 410(2) in the trenches 409. A first conductive layer 410(1) is disposed the dielectric layer 412 in the trenches 409. Then, as also shown in fabrication stage 800C in FIG. 8C, a metal layer 804 is disposed on the first surface 404(1) in contact with the second conductive layer 410(2) to provide metal contacts 806 to facilitate providing a conductive contact interface to the capacitors 406 (block 706 in FIG. 7A). A passivation layer 808 is then disposed on the metal layer 804 to provide portions of the metal layer 410 that will not be exposed as providing the metal contacts 420 (block 706 in FIG. 7A).

Then, as shown in the fabrication stage 800D in FIG. 8D, an insulating layer 810 is disposed on the passivation layer 808 (block 708 in FIG. 7B). In this example, the insulating layer 810 is a solder resist layer made of a material that is resistant to solder. A masking layer 812 is then disposed on insulating layer 408 to so that a lithography mask can be applied to form the openings in the insulating layer 408 and passivation layer 808 above the metal contacts 806 of the capacitors 406 (block 708 in FIG. 7B). Then, as shown in the fabrication stage 800E in FIG. 8E, the lithography mask is applied to form the openings 813 in the insulating layer 810 and passivation layer 808 above the metal contacts 806 of the capacitors 406 (block 710 in FIG. 7B). This provides access to the metal contacts 806 so that an electrical connection can be made to the capacitors 406. Then, as shown in the fabrication stage 800F in FIG. 8F, the masking layer 812 is removed and the metal contacts 420, 426 are formed on the insulating layer 810 (block 712 in FIG. 7B). The metal contacts 420 are formed in the openings 412 and in contact with the metal contacts 806 for providing an electrical interface to the capacitors 406. The metal contacts 426 are for providing bypass signal routing through the DTC 402. For example, the metal contacts 426 may be formed as re-distributed metal pads in the insulating layer 418 with a re-distributed metal line 432 interconnecting the metal contacts, such that the outer metallization layer 408 is a RDL. This allows a RDL process to be employed to form the additional metal contacts 426 interconnected by a metal line 432 to form the signal bypass routing path(s) in the outer metallization layer 408 of the DTC 402. Forming the metal contacts 426 through a RDL process allows the metal contacts 426 to be relocated in a horizontal direction (X- and Y-axes directions) to provide the designed location for bypass signal lines.

Then, as shown in the fabrication stage 800G in FIG. 8G, the insulating layer 418 of the outer metallization layer 408 is disposed on the metal contacts 420, 426 (block 714 in FIG. 7C). The insulating layer 418 and metal contacts 420, 426 are the outer metallization layer 408 of the DTC 402. Also, as shown in the fabrication stage 800G in FIG. 8G, an under bump metallization (UBM) layer 816 is disposed on the metal contacts 420, 426 to prepare for external interconnects (e.g., solder balls) to be formed in contact with the UBM layer 816 to provide an external interface to the capacitors 406 (block 714 in FIG. 7C). Then, as shown in fabrication stage 800H in FIG. 8H, the external interconnects 818 are formed in contact with the metal contacts 420, 426 (block 716 in FIG. 7C).

Figures 9A, 10A, 10B:
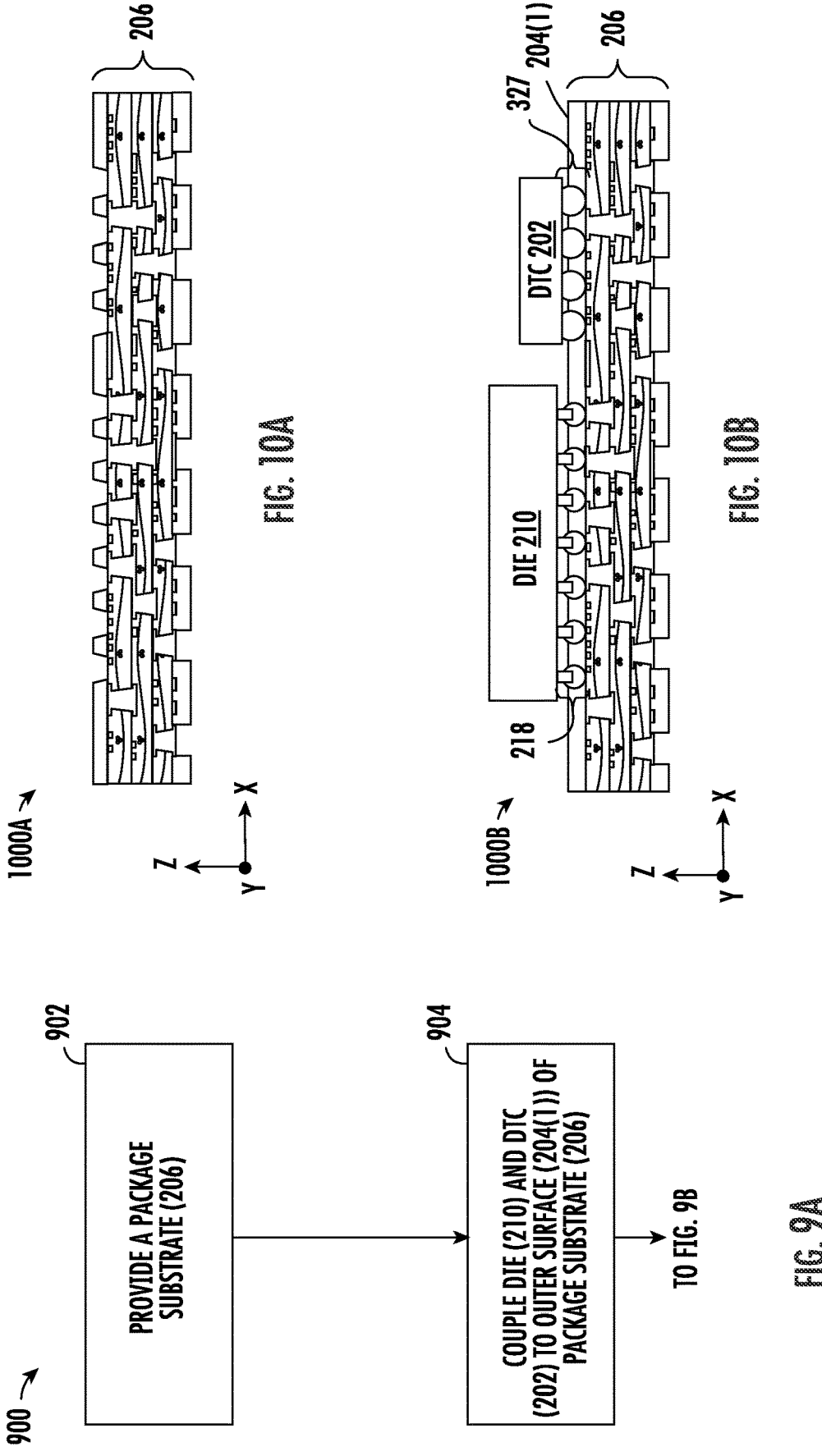
FIG. 9A-9C is a flowchart illustrating an exemplary IC package fabrication process of fabricating an IC package that includes coupling a DTC to a package substrate of the IC package, wherein the DTC includes an outer metallization layer that includes additional metal interconnects interconnected to each other by metal lines to provide bypass signal routes through the DTC, including but not limited to the DTCs in FIGS. 2-4B and 5C.
FIGS. 10A-10F are exemplary fabrication stages during fabrication of an IC package according to the exemplary IC package fabrication process in FIGS. 9A-9C.
Figures 9B, 10C, 10D:
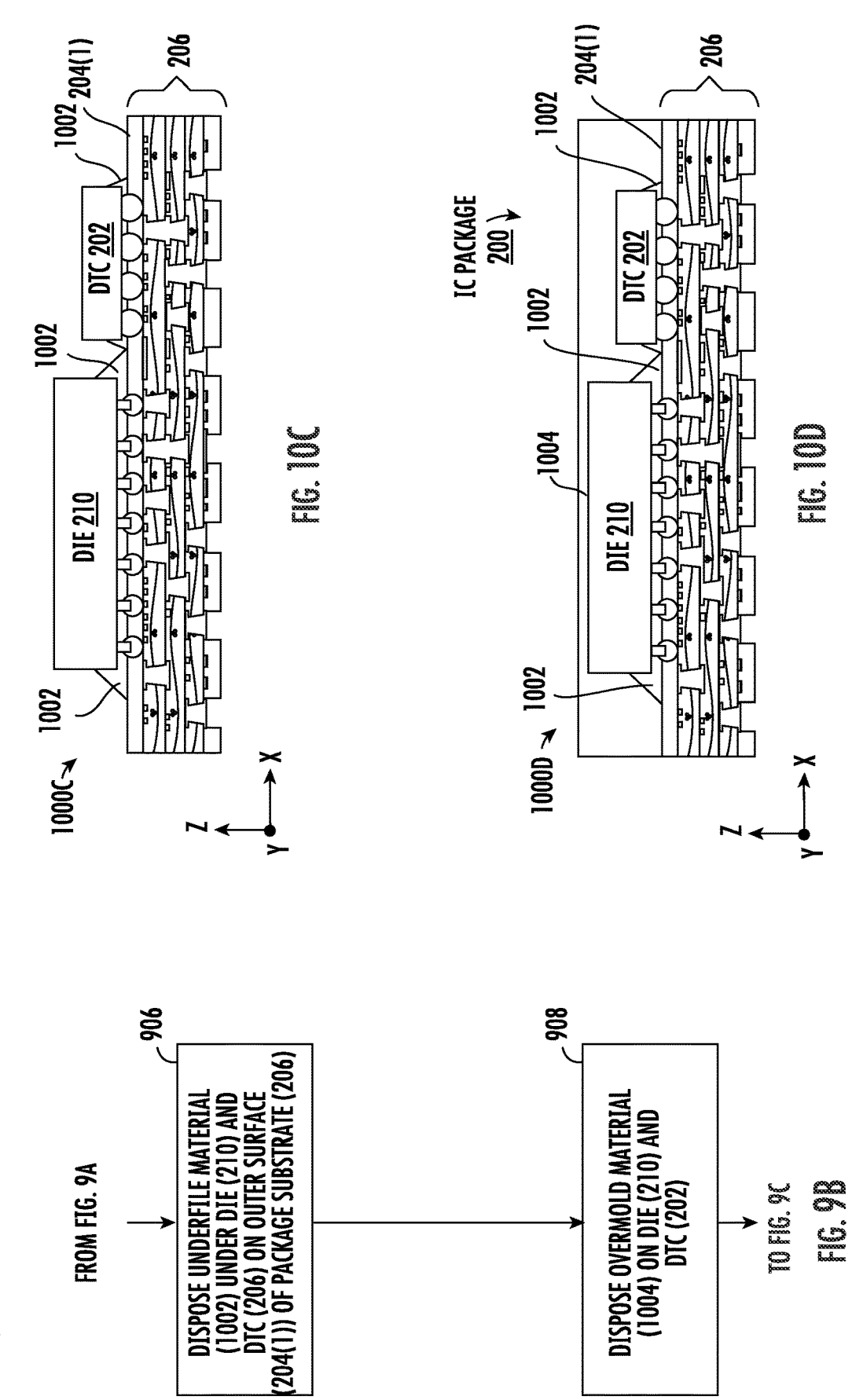
Figures 9C, 10E, 10F:
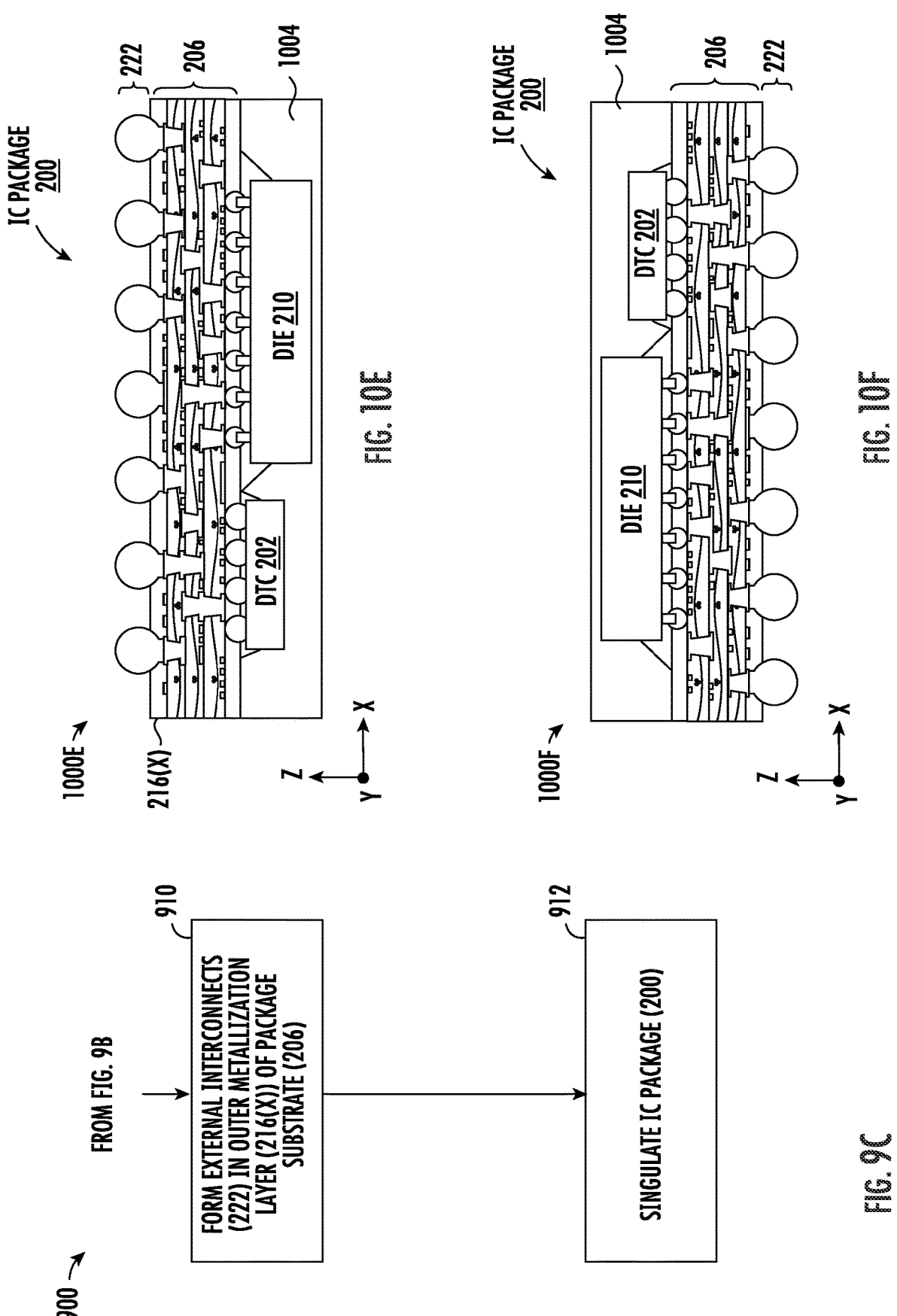

Fabrication processes can also be employed to fabricate an IC package that includes a DTC that includes additional metal interconnects formed in a metallization layer and interconnected to each other by metal lines in the outer metallization layer to provide bypass signal routes through the DTC, including but not limited to the IC package 200 in FIG. 2 and the DTCs 202, 202(1)-202(3), 402, 520 in FIGS. 2-4B, 5C, and 8A-8H. In this regard, FIGS. 9A-9C is a flowchart illustrating another exemplary fabrication process 900 of fabricating an IC package that includes a die interconnected to a DTC that includes additional metal interconnects formed in a metallization layer and interconnected to each other by metal lines in the outer metallization layer to provide bypass signal routes through the DTC, including but not limited to the DTCs 202, 202(1)-202(3), 402, 520 in FIGS. 2-4B and 5C. FIGS. 10A-10F are exemplary fabrication stages 1000A-1000F during fabrication of the IC package according to the fabrication process 900 in FIGS. 9A-9C. The fabrication process 900 in FIGS. 9A-9C, and as shown in the fabrication stages 1000A-1000F in FIGS. 10A-10F, are discussed in reference to the IC package 200 in FIG. 2, but note that such is not limiting.

In this regard, as shown in the fabrication stage 1000A in FIG. 10A, a first step in fabricating the IC package 200 is to provide or fabricate the package substrate 206 (block 902 in FIG. 9A). Then, as shown in the fabrication stage 1000B in FIG. 10B, a next step in fabricating the IC package 200 is coupling the die 210 (via the metal bumps 218) and coupling the DTC 202 (via the external metal bumps 227) to the outer surface 204(1) of the package substrate 206 (block 904 in FIG. 9A). Then, as shown in the fabrication stage 1000C in FIG. 10C, a next step in fabricating the IC package 200 is to dispose an underfill material 1002 under the die 910 and the DTC 202 on the outer surface 204(1) of the package substrate 206 to support the die 910 and the DTC 202 on the package substrate 206 (block 906 in FIG. 9B). Then, as shown in the fabrication stage 1000D in FIG. 10D, a next step in fabricating the IC package 200 is to dispose an overmold material 1004 on the die 210 and the DTC 202 to protect and insulate the die 210 and the DTC 202 (block 908 in FIG. 9B).

Then, as shown in the fabrication stage 1000E in FIG. 10E, a next step in fabricating the IC package 200 is to form the external interconnects 222 in the openings in the outer metallization layer 216(X) of the package substrate 206 to provide an external interface for the die 210 and/or the DTC 202 in the IC package 200 (block 910 in FIG. 9C). Then, as shown in the fabrication stage 1000F in FIG. 10F, a next step in fabricating the IC package 200 is to singulate the IC package 200 (block 912 in FIG. 9C). For example, in the previous fabrication stages 1000A-1000E, the IC package 200 may have been fabricated along with other IC packages on a wafer in which a package substrate 206 was provided for a plurality of IC packages.

Note that the term "outer" is a relative term and not necessarily limited to a component described as a "top" or "bottom" component being above or below another component. Also note that a component described as "disposed in" a layer or package substrate herein is not limited to such component being fully disposed in such layer or package substrate. Also note that the term "external" as used here is to describe a component with regard to a package substrate is a component that that is fully or partially exposed from an outer surface of a package substrate.

IC packages that include a DTC(s) that includes additional metal interconnects interconnected to each other by metal lines in the outer metallization layer of the DTC to provide bypass signal routes through the DTC including but not limited to the DTCs in FIGS. 2-4B, 5C, and 8A-8H, including but not limited to the IC packages in FIGS. 2 and 10A-10F, and according to, but not limited to, any of the exemplary fabrication processes in FIGS. 7A-7C and 9A-9C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, laptop computer, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 11:
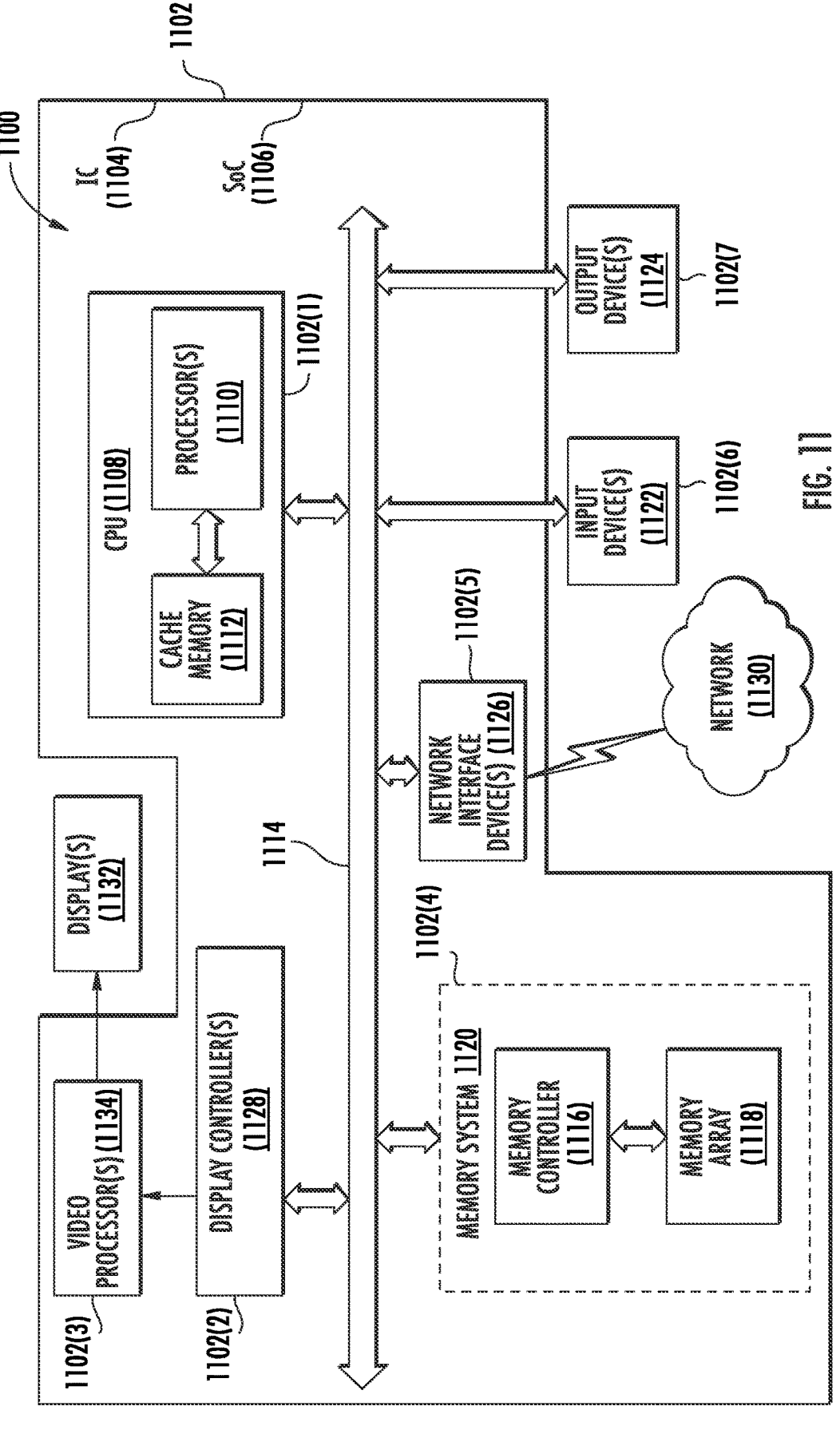
FIG. 11 is a block diagram of an exemplary processor-based system that can include components that can include an IC package that includes a DTC that includes additional metal interconnects interconnected to each other by metal lines in the outer metallization layer of the DTC to provide bypass signal routes through the DTC including but not limited to the DTCs in FIGS. 2-4B, 5C, and 8A-8H, including but not limited to the IC packages in FIGS. 2 and 10A-10F, and according to, but not limited to, any of the exemplary fabrication processes in FIGS. 7A-7C and 9A-9C.

In this regard, FIG. 11 illustrates an example of a processor-based system 1100 including a circuit that can be provided in one or more IC packages 1102(1)-1102(7). The IC packages 1102(1)-1102(7) can include a DTC(s) that includes additional metal interconnects interconnected to each other by metal lines in the outer metallization layer of the DTC to provide bypass signal routes through the DTC including, but not limited to, the DTCs in FIGS. 2-4B, 5C, and 8A-8H, including but not limited to the IC packages in FIGS. 2 and 10A-10F, and according to, but not limited to, any of the exemplary fabrication processes in FIGS. 7A-7C and 9A-9C. In this example, the processor-based system 1100 may be formed as an IC 1104 in an IC package 1102 and as a system-on-a-chip (SoC) 1106. The processor-based system 1100 includes a central processing unit (CPU) 1108 that includes one or more processors 1110, which may also be referred to as CPU cores or processor cores. The CPU 1108 may have cache memory 1112 coupled to the CPU 1108 for rapid access to temporarily stored data. The CPU 1108 is coupled to a system bus 1114 and can intercouple master and slave devices included in the processor-based system 1100. As is well known, the CPU 1108 communicates with these other devices by exchanging address, control, and data information over the system bus 1114. For example, the CPU 1108 can communicate bus transaction requests to a memory controller 1116, as an example of a slave device. Although not illustrated in FIG. 11, multiple system buses 1114 could be provided, wherein each system bus 1114 constitutes a different fabric.

Other master and slave devices can be connected to the system bus 1114. As illustrated in FIG. 11, these devices can include a memory system 1120 that includes the memory controller 1116 and a memory array(s) 1118, one or more input devices 1122, one or more output devices 1124, one or more network interface devices 1126, and one or more display controllers 1128, as examples. Each of the memory system(s) 1120, the one or more input devices 1122, the one or more output devices 1124, the one or more network interface devices 1126, and the one or more display controllers 1128 can be provided in the same or different IC packages 1102(2)-1102(7). The input device(s) 1122 can include any type of input device, including, but not limited to, input keys, switches, voice processors, etc. The output device(s) 1124 can include any type of output device, including, but not limited to, audio, video, other visual indicators, etc. The network interface device(s) 1126 can be any device configured to allow exchange of data to and from a network 1130. The network 1130 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1126 can be configured to support any type of communications protocol desired.

The CPU 1108 may also be configured to access the display controller(s) 1128 over the system bus 1114 to control information sent to one or more displays 1132. The display controller(s) 1128 sends information to the display (s) 1132 to be displayed via one or more video processor(s) 1134, which process the information to be displayed into a format suitable for the display(s) 1132. The display controller(s) 1128 and video processor(s) 1134 can be included as ICs in the same or different IC packages 1102(2), 1102(3), and in the same or different IC package 1102 containing the CPU 1108, as an example. The display(s) 1132 can include any type of display, including, but not limited to, a cathode ray tube (CRT), a liquid crystal display (LCD), a plasma display, a light emitting diode (LED) display, etc.

Figure 12:
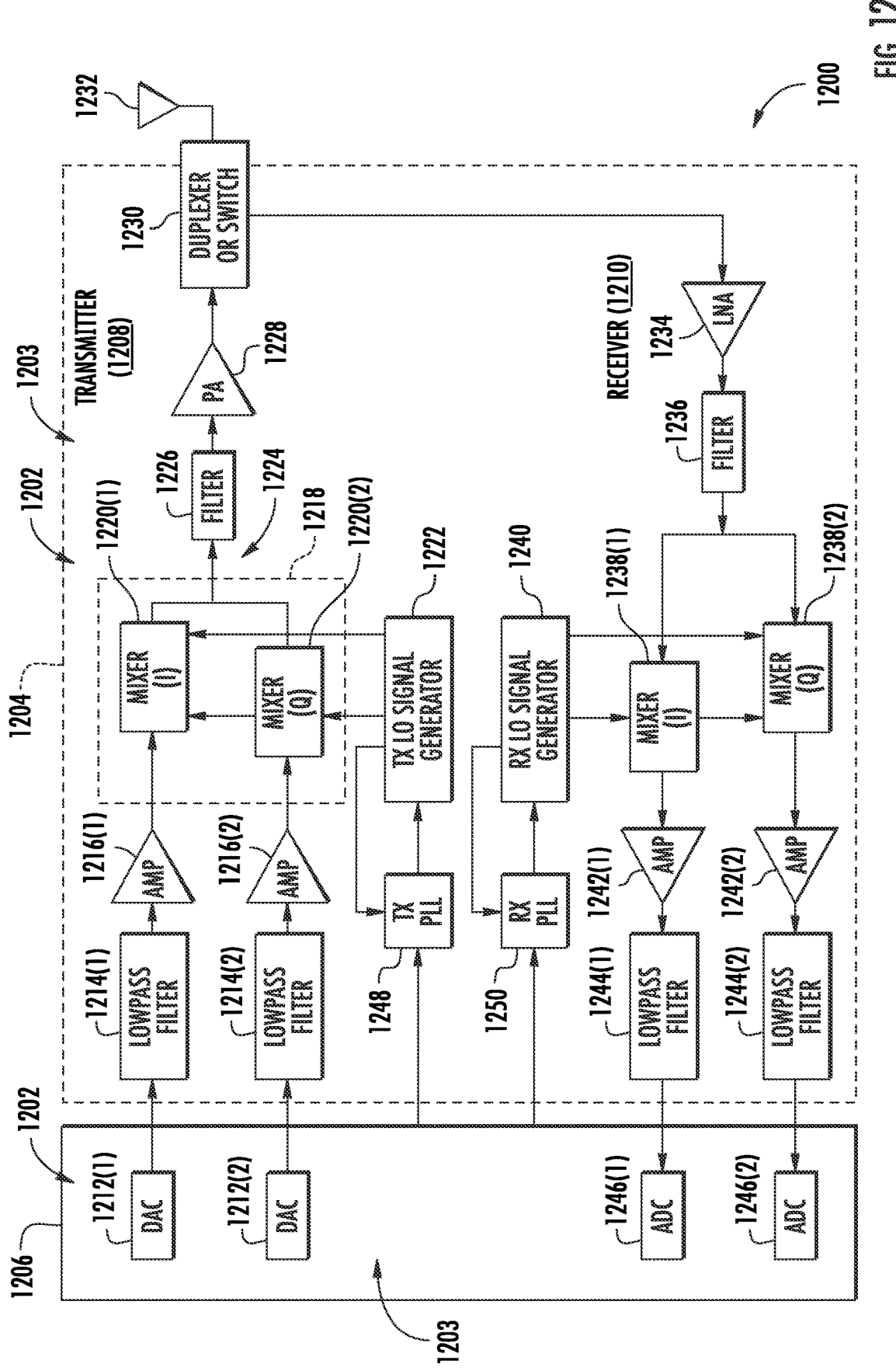
FIG. 12 is a block diagram of an exemplary wireless communication device that includes radio-frequency (RF) components that can include an IC package that includes a DTC that includes additional metal interconnects interconnected to each other by metal lines in the outer metallization layer of the DTC to provide bypass signal routes through the DTC including but not limited to the DTCs in FIGS. 2-4B, 5C, and 8A-8H, including but not limited to the IC packages in FIGS. 2 and 10A-10F, and according to, but not limited to, any of the exemplary fabrication processes in FIGS. 7A-7C and 9A-9C.

FIG. 12 illustrates an exemplary wireless communications device 1200 that includes radio-frequency (RF) components formed from one or more ICs 1202, wherein any of the ICs 1202 can be included in an IC package 1203 that includes a DTC(s) that includes additional metal interconnects interconnected to each other by metal lines in the outer metallization layer of the DTC to provide bypass signal routes through the DTC including but not limited to the DTCs in FIGS. 2-4B, 5C, and 8A-8H, including but not limited to the IC packages in FIGS. 2 and 10A-10F, and according to, but not limited to, any of the exemplary fabrication processes in FIGS. 7A-7C and 9A-9C. The wireless communications device 1200 may include or be provided in any of the above-referenced devices, as examples. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RF ICs (RFICs), mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, for example, from RF to an intermediate frequency (IF) in one stage, and then from IF to baseband in another stage for the receiver 1210. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into the I and Q analog output signals (e.g., I and Q output currents) for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals through mixers 1220(1), 1220(2) from a TX LO signal generator 1222 to provide an upconverted signal 1224. A filter 1226 filters the upconverted signal 1224 to remove undesired signals caused by the frequency up-conversion as well as noise in a receive frequency band. A power amplifier (PA) 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Down-conversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206. In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency up-conversion, while the RX LO signal generator 1240 generates the I and Q RX LO signals used for frequency down-conversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. A deep trench capacitor (DTC), comprising:
    a substrate comprising a first surface and a first side;
    a first capacitor disposed in the substrate, the first capacitor comprising a first conductive layer and a second conductive layer;
    a metallization layer adjacent to the first surface, the metallization layer comprising:
        an insulating layer;
        a first metal contact disposed in the insulating layer and coupled to the first conductive layer;
        a second metal contact disposed in the insulating layer and coupled to the second conductive layer;
        a third metal contact disposed in the insulating layer, the third metal contact adjacent to the first surface of the substrate;

a fourth metal contact disposed in the insulating layer, the fourth metal contact adjacent to the first surface of the substrate; and
        a first metal line disposed in the insulating layer, the first metal line coupling the third metal contact to the fourth metal contact.
2. The DTC of clause 1, wherein the third metal contact and the fourth metal contact are not coupled to the first capacitor.
3. The DTC of clause 1 or 2, wherein the metallization layer further comprises:
    a fifth metal contact disposed in the insulating layer, the fifth metal contact adjacent to the first surface of the substrate;
    a sixth metal contact disposed in the insulating layer, the sixth metal contact adjacent to the first surface of the substrate; and
    a second metal line disposed in the insulating layer, the second metal line coupling the fifth metal contact to the sixth metal contact.
4. The DTC of any of clauses 1 to 3, wherein the metallization layer further comprises:
    a first contact row comprising the first metal contact and the second metal contact aligned along a first longitudinal axis; and
    a second contact row comprising a fifth metal contact and a sixth metal contact aligned along a second longitudinal axis parallel to the first longitudinal axis, the fifth metal contact coupled to the first conductive layer and the sixth metal contact coupled to the second conductive layer;
    the first metal line disposed between the first contact row and the second contact row along a third longitudinal axis parallel to the first longitudinal axis.
5. The DTC of clause 4, wherein the metallization layer further comprises:
    a third contact row comprising a seventh metal contact and an eighth metal contact aligned along a fourth longitudinal axis between the first parallel to the first longitudinal axis and disposed between the first longitudinal axis and the second longitudinal axis, the seventh metal contact coupled to the first conductive layer and the eighth metal contact coupled to the second conductive layer;
    a ninth metal contact disposed in the insulating layer, the ninth metal contact adjacent to the first surface of the substrate;
    a tenth metal contact disposed in the insulating layer, the tenth metal contact adjacent to the first surface of the substrate; and
    a second metal line disposed in the insulating layer, the second metal line coupling the ninth metal contact to the tenth metal contact, the second metal line disposed between the second contact row and the third contact row along a fifth longitudinal axis parallel to the first longitudinal axis.
6. The DTC of clause 4 or 5, wherein:
    the third metal contact is disposed in the first contact row; and
    the fourth metal contact is disposed in the first contact row.
7. The DTC of clause 4 or 5, wherein:
    the third metal contact is disposed in the first contact row; and
    the fourth metal contact is disposed in the second contact row.

8. The DTC of any of clauses 1 to 7, wherein the metallization layer further comprises:
  a fifth metal contact disposed in the insulating layer, the fifth metal contact adjacent to the first surface of the substrate; and
  a second metal line disposed in the insulating layer, the second metal line coupling the third metal contact to the fifth metal contact.

9. The DTC of any of clauses 1 to 8, wherein the first capacitor is disposed in the substrate between the first surface and a second surface of the substrate opposite the first surface.

10. The DTC of any of clauses 1 to 9, wherein the first capacitor is disposed in the substrate between the third metal contact and the fourth metal contact.

11. The DTC of any of clauses 1 to 10, wherein:
  the first surface of the substrate is disposed in a first plane;
  the first side of the substrate is disposed in a second plane orthogonal to the first plane; and
  a second surface of the substrate opposite the first surface is disposed in a third plane parallel to the first plane.

12. The DTC of any of clauses 1 to 11, further comprising one or more trenches disposed in the substrate, the one or more trenches each comprising an opening in the first surface of the substrate;
  wherein the first capacitor is disposed in the one or more trenches.

13. The DTC of any of clauses 1 to 12, further comprising a second capacitor disposed in the substrate, the second capacitor comprising a third conductive layer and a fourth conductive layer;
  wherein the metallization layer further comprises:
    a fifth metal contact disposed in the insulating layer and coupled to the third conductive layer; and
    a sixth metal contact disposed in the insulating layer and coupled to the fourth conductive layer.

14. The DTC of any of clauses 1 to 13, wherein:
  the metallization layer comprises a redistribution layer (RDL); and
  the first metal line comprises a RDL metal line coupling the third metal contact to the fourth metal contact.

15. The DTC of any of clauses 1 to 14, wherein the metallization layer comprises a solder resist layer, wherein the insulating layer comprises a solder resist material.

16. The DTC of any of clauses 1 to 15 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A method of fabricating a deep trench capacitor (DTC), comprising:

providing a substrate comprising a first surface and a first side;
  forming a first capacitor in the substrate, the first capacitor comprising a first conductive layer and a second conductive layer; and
  forming a metallization layer adjacent to the first surface of the substrate, comprising:
    forming an insulating layer;
    forming a first metal contact disposed in the insulating layer and coupled to the first conductive layer;
    forming a second metal contact in the insulating layer and coupled to the second conductive layer;
    forming a third metal contact in the insulating layer and adjacent to the first surface of the substrate;
    forming a fourth metal contact disposed in the insulating layer and adjacent to the first surface of the substrate; and
    forming a first metal line in the insulating layer coupled to the third metal contact and the fourth metal contact.

18. The method of clause 17, further comprising not coupling the third metal contact and the fourth metal contact to the first capacitor.

19. The method of clause 17 or 18, wherein forming the metallization layer further comprises:
  forming a fifth metal contact in the insulating layer and adjacent to the first surface of the substrate;
  forming a sixth metal contact in the insulating layer and adjacent to the first surface of the substrate; and
  forming second metal line in the insulating layer coupled to the fifth metal contact and the sixth metal contact.

20. The method of any of clauses 17 to 19, wherein the metallization layer further comprises:
  forming a first contact row in the insulating layer, comprising:
    forming the first metal contact in the insulating layer coupled to the first metal contact to the first conductive layer; and
    forming the second metal contact aligned along a first longitudinal axis with the first metal contact in the insulating layer and coupled to the second metal contact to the second conductive layer;
  forming a second contact row comprising:
    forming a fifth metal contact in the insulating layer coupled to the first conductive layer; and
    forming a sixth metal contact in the insulating layer aligned along a second longitudinal axis with the first metal contact and coupled to the second metal contact to the second conductive layer, the second longitudinal axis parallel to the first longitudinal axis; and
  forming the first metal line further comprises forming the first metal line between the first contact row and the second contact row along a third longitudinal axis parallel to the first longitudinal axis.

21. The method of any of clauses 17 to 20, further comprising:
  forming a metal layer on the first surface of the substrate;
  forming the insulating layer adjacent to the metal layer;
  forming a masking layer on the insulating layer;
  forming openings in the insulating layer to form:
    a fifth metal contact in the metal layer coupled to the first conductive layer;

a sixth metal contact in the metal layer coupled to the second conductive layer;

a seventh metal contact in the metal layer adjacent to the first surface of the substrate; and an eighth metal contact in the metal layer to the first surface of the substrate.

22. The method of clause 21, wherein:

forming the first metal contact further comprises forming the first metal contact in contact with the fifth metal contact;

forming the second metal contact further comprises forming the second metal contact in contact with the sixth metal contact;

forming the third metal contact further comprises forming the third metal contact in contact with the seventh metal contact; and forming the fourth metal contact further comprises forming the fourth metal contact in contact with the eighth metal contact.

23. The method of any of clauses 17 to 22, wherein forming the first metal line in the insulating layer coupled to the third metal contact and the fourth metal contact comprises forming a redistributed metal line in the insulating layer coupled to the third metal contact and the fourth metal contact.

24. An integrated circuit (IC) package, comprising:

a package substrate comprising a first surface and one or more first metallization layers each comprising one or more metal interconnects;

a die coupled to the first surface of the package substrate; and a deep trench capacitor (DTC) coupled to the package substrate, the DTC comprising:

a substrate comprising a third surface, a first side, and a fourth surface opposite the first surface;

a first capacitor disposed in the substrate, the first capacitor comprising a first conductive layer and a second conductive layer; and a second metallization layer adjacent to the third surface, the second metallization layer comprising:

an insulating layer;

a first metal contact disposed in the insulating layer and coupled to the first conductive layer;

a second metal contact disposed in the insulating layer and coupled to the second conductive layer;

a third metal contact disposed in the insulating layer, the third metal contact adjacent to the third surface of the substrate;

a fourth metal contact disposed in the insulating layer, the fourth metal contact adjacent to the fourth surface of the substrate; and a first metal line disposed in the insulating layer, the first metal line coupling the third metal contact to the fourth metal contact;

wherein:

the one or more first metallization layers further comprises a third metallization layer comprising a first metal interconnect coupled to the third metal contact; and the third metallization layer further comprises a second metal interconnect coupled to the fourth metal contact.

25. The IC package of clause 24, wherein the first capacitor is coupled to the first surface of the package substrate.

26. The IC package of clause 24, wherein the first capacitor is coupled to a second surface of the package substrate opposite the first surface.

27. The IC package of clause 24, wherein the first capacitor is embedded in the package substrate.

28. The IC package of any of clauses 24 to 27, wherein:

the die is coupled a second metal interconnect of the one or more metal interconnects in the package substrate;

the die is coupled a third metal interconnect of the one or more metal interconnects in the package substrate;

the second metal interconnect is coupled to the first metal contact; and the third metal interconnect is coupled to the second metal contact.

29. The IC package of any of clauses 24 to 28, wherein the third metal contact and the fourth metal contact are not coupled to the first capacitor.

30. The IC package of any of clauses 24 to 29, wherein the second metallization layer further comprises:

a first contact row comprising the first metal contact and the second metal contact aligned along a first longitudinal axis; and a second contact row comprising a fifth metal contact and a sixth metal contact aligned along a second longitudinal axis parallel to the first longitudinal axis, the fifth metal contact coupled to the first conductive layer and the sixth metal contact coupled to the second conductive layer;

the first metal line disposed between the first contact row and the second contact row along a third longitudinal axis parallel to the first longitudinal axis.

31. The IC package of clause 30, wherein:

the third metal contact is disposed in the first contact row; and the fourth metal contact is disposed in the first contact row.

32. The IC package of clause 30, wherein:

the third metal contact is disposed in the first contact row; and the fourth metal contact is disposed in the second contact row.

33. The IC package of any of clauses 24 to 32, wherein:

the second metallization layer comprises a redistribution layer (RDL); and the first metal line comprises a RDL metal line coupling the third metal contact to the fourth metal contact.

What is claimed is:

1. A deep trench capacitor (DTC), comprising:

a substrate comprising a first surface;

a first capacitor disposed in the substrate, the first capacitor comprising a first conductive layer and a second conductive layer; and a metallization layer adjacent to the first surface, the metallization layer comprising:

an insulating layer;

a first metal contact disposed in the insulating layer and coupled to the first conductive layer;

a second metal contact disposed in the insulating layer and coupled to the second conductive layer;

a third metal contact disposed in the insulating layer, the third metal contact adjacent to the first surface of the substrate;

a fourth metal contact disposed in the insulating layer, the fourth metal contact adjacent to the first surface of the substrate; and a first metal line disposed in the insulating layer, the first metal line coupling the third metal contact to the fourth metal contact;

wherein the third metal contact and the fourth metal contact are not electrically coupled to the first capacitor.

2. The DTC of claim 1, wherein the metallization layer further comprises:

a fifth metal contact disposed in the insulating layer, the fifth metal contact adjacent to the first surface of the substrate;

a sixth metal contact disposed in the insulating layer, the sixth metal contact adjacent to the first surface of the substrate; and a second metal line disposed in the insulating layer, the second metal line coupling the fifth metal contact to the sixth metal contact.

3. The DTC of claim 1, wherein the metallization layer further comprises:

a first contact row comprising the first metal contact and the second metal contact aligned along a first longitudinal axis; and a second contact row comprising a fifth metal contact and a sixth metal contact aligned along a second longitudinal axis parallel to the first longitudinal axis, the fifth metal contact coupled to the first conductive layer and the sixth metal contact coupled to the second conductive layer;

the first metal line disposed between the first contact row and the second contact row along a third longitudinal axis parallel to the first longitudinal axis.

4. The DTC of claim 3, wherein the metallization layer further comprises:

a third contact row comprising a seventh metal contact and an eighth metal contact aligned along a fourth longitudinal axis between the first parallel to the first longitudinal axis and disposed between the first longitudinal axis and the second longitudinal axis, the seventh metal contact coupled to the first conductive layer and the eighth metal contact coupled to the second conductive layer;

a ninth metal contact disposed in the insulating layer, the ninth metal contact adjacent to the first surface of the substrate;

a tenth metal contact disposed in the insulating layer, the tenth metal contact adjacent to the first surface of the substrate; and a second metal line disposed in the insulating layer, the second metal line coupling the ninth metal contact to the tenth metal contact, the second metal line disposed between the second contact row and the third contact row along a fifth longitudinal axis parallel to the first longitudinal axis.

5. The DTC of claim 3, wherein:

the third metal contact is disposed in the first contact row; and the fourth metal contact is disposed in the first contact row.

6. The DTC of claim 3, wherein:

the third metal contact is disposed in the first contact row; and the fourth metal contact is disposed in the second contact row.

7. The DTC of claim 1, wherein the metallization layer further comprises:

a fifth metal contact disposed in the insulating layer, the fifth metal contact adjacent to the first surface of the substrate; and a second metal line disposed in the insulating layer, the second metal line coupling the third metal contact to the fifth metal contact.

8. The DTC of claim 1, wherein the first capacitor is disposed in the substrate between the first surface and a second surface of the substrate opposite the first surface.

9. The DTC of claim 1, wherein the first capacitor is disposed in the substrate between the third metal contact and the fourth metal contact.

10. The DTC of claim 1, wherein:

the first surface of the substrate is disposed in a first plane;

a first side of the substrate is disposed in a second plane orthogonal to the first plane; and a second surface of the substrate opposite the first surface is disposed in a third plane parallel to the first plane.

11. The DTC of claim 1, further comprising one or more trenches disposed in the substrate, the one or more trenches each comprising an opening in the first surface of the substrate;

wherein the first capacitor is disposed in the one or more trenches.

12. The DTC of claim 1, further comprising a second capacitor disposed in the substrate, the second capacitor comprising a third conductive layer and a fourth conductive layer;

wherein the metallization layer further comprises:

a fifth metal contact disposed in the insulating layer and coupled to the third conductive layer; and a sixth metal contact disposed in the insulating layer and coupled to the fourth conductive layer.

13. The DTC of claim 1, wherein:

the metallization layer comprises a redistribution layer (RDL); and the first metal line comprises a RDL metal line coupling the third metal contact to the fourth metal contact.

14. The DTC of claim 1, wherein the metallization layer comprises a solder resist layer, wherein the insulating layer comprises a solder resist material.

15. The DTC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A method of fabricating a deep trench capacitor (DTC), comprising:

providing a substrate comprising a first surface;

forming a first capacitor in the substrate, the first capacitor comprising a first conductive layer and a second conductive layer; and forming a metallization layer adjacent to the first surface of the substrate, comprising:

forming an insulating layer;

forming a first metal contact disposed in the insulating layer and coupled to the first conductive layer;

forming a second metal contact in the insulating layer and coupled to the second conductive layer;

forming a third metal contact in the insulating layer and adjacent to the first surface of the substrate;

forming a fourth metal contact disposed in the insulating layer and adjacent to the first surface of the substrate;

forming a first metal line in the insulating layer coupled to the third metal contact and the fourth metal contact; and not electrically coupling the third metal contact and the fourth metal contact to the first capacitor.

17. The method of claim 16, wherein forming the metallization layer further comprises:

forming a fifth metal contact in the insulating layer and adjacent to the first surface of the substrate;

forming a sixth metal contact in the insulating layer and adjacent to the first surface of the substrate; and forming second metal line in the insulating layer coupled to the fifth metal contact and the sixth metal contact.

18. The method of claim 16, wherein the metallization layer further comprises:

forming a first contact row in the insulating layer, comprising:

forming the first metal contact in the insulating layer coupled to the first metal contact to the first conductive layer; and forming the second metal contact aligned along a first longitudinal axis with the first metal contact in the insulating layer and coupled to the second metal contact to the second conductive layer;

forming a second contact row comprising:

forming a fifth metal contact in the insulating layer coupled to the first conductive layer; and forming a sixth metal contact in the insulating layer aligned along a second longitudinal axis with the first metal contact and coupled to the second metal contact to the second conductive layer, the second longitudinal axis parallel to the first longitudinal axis; and forming the first metal line further comprises forming the first metal line between the first contact row and the second contact row along a third longitudinal axis parallel to the first longitudinal axis.

19. The method of claim 16, further comprising:

forming a metal layer on the first surface of the substrate;

forming the insulating layer adjacent to the metal layer;

forming a masking layer on the insulating layer;

forming openings in the insulating layer to form:

a fifth metal contact in the metal layer coupled to the first conductive layer;

a sixth metal contact in the metal layer coupled to the second conductive layer;

a seventh metal contact in the metal layer adjacent to the first surface of the substrate; and an eighth metal contact in the metal layer to the first surface of the substrate.

20. The method of claim 19, wherein:

forming the first metal contact further comprises forming the first metal contact in contact with the fifth metal contact;

forming the second metal contact further comprises forming the second metal contact in contact with the sixth metal contact;

forming the third metal contact further comprises forming the third metal contact in contact with the seventh metal contact; and forming the fourth metal contact further comprises forming the fourth metal contact in contact with the eighth metal contact.

21. The method of claim 16, wherein forming the first metal line in the insulating layer coupled to the third metal contact and the fourth metal contact comprises forming a redistributed metal line in the insulating layer coupled to the third metal contact and the fourth metal contact.

22. An integrated circuit (IC) package, comprising:

a package substrate comprising a first surface and one or more first metallization layers each comprising one or more metal interconnects;

a die coupled to the first surface of the package substrate; and a deep trench capacitor (DTC) coupled to the package substrate, the DTC comprising:

a substrate comprising a third surface and a fourth surface opposite the first surface;

a first capacitor disposed in the substrate, the first capacitor comprising a first conductive layer and a second conductive layer; and a second metallization layer adjacent to the third surface, the second metallization layer comprising:

an insulating layer;

a first metal contact disposed in the insulating layer and coupled to the first conductive layer;

a second metal contact disposed in the insulating layer and coupled to the second conductive layer;

a third metal contact disposed in the insulating layer, the third metal contact adjacent to the third surface of the substrate;

a fourth metal contact disposed in the insulating layer, the fourth metal contact adjacent to the fourth surface of the substrate; and a first metal line disposed in the insulating layer, the first metal line coupling the third metal contact to the fourth metal contact;

wherein the third metal contact and the fourth metal contact are not electrically coupled to the first capacitor;

wherein:

the one or more first metallization layers further comprises a third metallization layer comprising a first metal interconnect coupled to the third metal contact; and the third metallization layer further comprises a second metal interconnect coupled to the fourth metal contact.

23. The IC package of claim 22, wherein the first capacitor is coupled to the first surface of the package substrate.

24. The IC package of claim 22, wherein the first capacitor is coupled to a second surface of the package substrate opposite the first surface.

25. The IC package of claim 22, wherein the first capacitor is embedded in the package substrate.

26. The IC package of claim 22, wherein:

the die is coupled a second metal interconnect of the one or more metal interconnects in the package substrate;

the die is coupled a third metal interconnect of the one or more metal interconnects in the package substrate;

the second metal interconnect is coupled to the first metal contact; and the third metal interconnect is coupled to the second metal contact.

27. The IC package of claim 22, wherein the second metallization layer further comprises:

a first contact row comprising the first metal contact and the second metal contact aligned along a first longitudinal axis; and a second contact row comprising a fifth metal contact and a sixth metal contact aligned along a second longitudinal axis parallel to the first longitudinal axis, the fifth metal contact coupled to the first conductive layer and the sixth metal contact coupled to the second conductive layer;

the first metal line disposed between the first contact row and the second contact row along a third longitudinal axis parallel to the first longitudinal axis.

28. The IC package of claim 27, wherein:

the third metal contact is disposed in the first contact row; and the fourth metal contact is disposed in the first contact row.

29. The IC package of claim 27, wherein:

the third metal contact is disposed in the first contact row; and the fourth metal contact is disposed in the second contact row.

30. The IC package of claim 22, wherein:

the second metallization layer comprises a redistribution layer (RDL); and the first metal line comprises a RDL metal line coupling the third metal contact to the fourth metal contact.

\*  \*  \*  \*  \*